(12) United States Patent
Kanemura et al.

(10) Patent No.: US 8,575,624 B2
(45) Date of Patent: Nov. 5, 2013

(54) SEMICONDUCTOR DEVICE

(75) Inventors: Takahisa Kanemura, Yokohama (JP); Masaki Kondo, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/403,177

(22) Filed: Feb. 23, 2012

(65) Prior Publication Data

US 2013/0037823 A1   Feb. 14, 2013

(30) Foreign Application Priority Data

Aug. 10, 2011   (JP) .................................. 2011-175214

(51) Int. Cl.
*H01L 29/15*   (2006.01)

(52) U.S. Cl.
USPC ............... 257/77; 257/295; 257/192; 257/12; 257/24; 257/26; 257/27; 257/76; 257/213; 257/220; 257/288; 257/187; 257/183; 257/302; 257/303; 257/330; 257/332; 257/367; 257/368; 257/369; 257/374

(58) Field of Classification Search
USPC ............. 257/77, 295, 192, 12, 24, 26, 27, 76, 257/213, 220, 288, 187, 183, 302, 303, 330, 257/332, 367, 368, 369, 374
See application file for complete search history.

(56) References Cited

U.S. PATENT DOCUMENTS

| | | | | |
|---|---|---|---|---|
| 4,982,266 A | * | 1/1991 | Chatterjee | 257/66 |
| 5,010,386 A | * | 4/1991 | Groover, III | 257/369 |
| 5,403,404 A | * | 4/1995 | Arya et al. | 136/249 |
| 5,616,510 A | * | 4/1997 | Wong | 438/259 |
| 6,207,977 B1 | * | 3/2001 | Augusto | 257/192 |
| 6,943,407 B2 | * | 9/2005 | Ouyang et al. | 257/329 |
| 7,453,113 B2 | * | 11/2008 | Ouyang et al. | 257/302 |
| 7,662,720 B2 | * | 2/2010 | Kim et al. | 438/700 |
| 7,791,108 B2 | * | 9/2010 | Hurkx et al. | 257/198 |

(Continued)

FOREIGN PATENT DOCUMENTS

| JP | 2001326356 A | * | 11/2001 |
|---|---|---|---|
| JP | 2004111872 A | * | 4/2004 |

(Continued)

OTHER PUBLICATIONS

Verhulst et al., Boosting the on-current of a n-channel nanowire tunnel field-effect transistor by source material optimization, 2008, J. Appl. Phys. 104, 064514.*

(Continued)

*Primary Examiner* — Bac Au
*Assistant Examiner* — Sophia Nguyen
(74) *Attorney, Agent, or Firm* — Oblon, Spivak, McClelland, Maier & Neustadt, L.L.P.

(57) ABSTRACT

In one embodiment, a semiconductor device includes a semiconductor substrate, a gate electrode provided on the semiconductor substrate via an insulating layer, and a gate insulator provided on a side surface of the gate electrode. The device includes a stacked layer including a lower main terminal layer of a first conductivity type, an intermediate layer, and an upper main terminal layer of a second conductivity type which are successively stacked on the semiconductor substrate, the stacked layer being provided on the side surface of the gate electrode via the gate insulator. The upper or lower main terminal layer is provided on the side surface of the gate electrode via the gate insulator and the semiconductor layer.

16 Claims, 16 Drawing Sheets

(56) References Cited

U.S. PATENT DOCUMENTS

| | | | |
|---|---|---|---|
| 8,241,983 B2* | 8/2012 | Iacopi et al. | 438/258 |
| 2008/0067495 A1* | 3/2008 | Verhulst | 257/12 |
| 2008/0191122 A1* | 8/2008 | Hongo et al. | 250/201.5 |
| 2011/0279125 A1* | 11/2011 | Bedell et al. | 324/444 |
| 2011/0303950 A1* | 12/2011 | Lauer et al. | 257/192 |
| 2012/0153263 A1* | 6/2012 | Chu-Kung et al. | 257/24 |

FOREIGN PATENT DOCUMENTS

| | | | | |
|---|---|---|---|---|
| JP | 2006013128 | A | * | 1/2006 |
| JP | 2007189266 | A | * | 7/2007 |
| JP | 2009094272 | A | * | 4/2009 |

OTHER PUBLICATIONS

Choi et al., Tunneling Field-Effect Transistors (TFETs) With Sub-threshold Swing (SS) Less Than 60 mV/dec, 2007, IEEE Electron Device Letters, vol. 28, No. 8, 743-745.*

Cheng et al., Characteristics of Cerium Oxide for Metal-Insulator-Metal Capacitors, 2010, Electrochemical and Solid-State Letters, 13 (1), H16-H19.*

Anupama Bowonder, et al., "Low-Voltage Green Transistor Using Ultra Shallow Junction and Hetero-Tunneling", IWJT '08, Extended Abstracts, International Workshop on Junction Technology, 93, 2008, 4 pages.

Anne S. Verhulst, et al., "Complementary Silicon-Based Heterostructure Tunnel-FETs With High Tunnel Rates", IEEE Electron Device Letters 29, 1398, 2008, 4 pages.

* cited by examiner

US 8,575,624 B2

SEMICONDUCTOR DEVICE

CROSS REFERENCE TO RELATED APPLICATION

This application is based upon and claims the benefit of priority from the prior Japanese Patent Application No. 2011-175214, filed on Aug. 10, 2011, the entire contents of which are incorporated herein by reference.

FIELD

Embodiments described herein relate to a semiconductor device.

BACKGROUND

A tunnel FET (tFET) is a transistor obtaining an on-current attributed to an interband tunnel current. A swing and a standby current of the tunnel FET are small compared with a conventional FET which obtains an on-current attributed to a drift current or a diffusion current in an inversion region.

However, the tunnel FET has a problem that the on-current of the tunnel FET is small compared with the conventional FET. In a case where a circuit is configured with FETs whose on-currents are small such as tunnel FETs, the operation of the circuit becomes slow. Therefore, various methods have been proposed to increase the on-current of the tunnel FET.

For example, there has been proposed a method in which an n type shallow region is formed on a p type source region in a semiconductor substrate to increase an area in which the tunnel current flows. In this method, however, a sufficient amount of on-current is not available unless a substrate area occupied by the tunnel FET is increased. In addition, the tunnel current flows through a side surface of the n type shallow region as well as a lower surface of the n type shallow region. This increases an off-current of the tunnel FET.

There has been proposed another method in which a source region is formed of a material having a narrow bandgap to make the tunnel current easy to flow. However, this method makes the off-current easy to flow as well as making the on-current easy to flow.

DETAILED DESCRIPTION

Embodiments will now be explained with reference to the accompanying drawings.

An embodiment described herein is a semiconductor device including a semiconductor substrate, a gate electrode provided on the semiconductor substrate via an insulating layer, and a gate insulator provided on a side surface of the gate electrode. The device includes a stacked layer including a lower main terminal layer of a first conductivity type, an intermediate layer, and an upper main terminal layer of a second conductivity type which are successively stacked on the semiconductor substrate, the stacked layer being provided on the side surface of the gate electrode via the gate insulator. The upper or lower main terminal layer is provided on the side surface of the gate electrode via the gate insulator and the semiconductor layer.

(First Embodiment)

Figure 1:
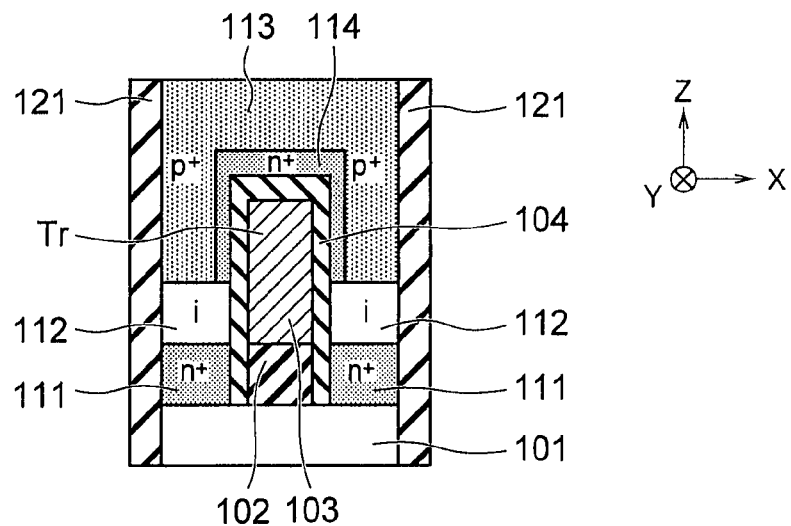
FIG. 1 is a cross-sectional view illustrating a structure of a semiconductor device of a first embodiment.

FIG. 1 is a cross-sectional view illustrating a structure of a semiconductor device of a first embodiment. FIG. 1 illustrates a tunnel FET denoted by reference character Tr.

As components of the tunnel FET, the semiconductor device of FIG. 1 includes a semiconductor substrate 101, an underlying insulator 102, a gate electrode 103, a gate insulator 104 and the like.

The semiconductor substrate 101 is, for example, a p type silicon substrate. FIG. 1 shows X and Y directions parallel to the principal surface of the semiconductor substrate 101 and perpendicular to each other, and a Z direction perpendicular to the principal surface of the semiconductor substrate 101.

The underlying insulator 102 is formed on the semiconductor substrate 101. The gate electrode 103 is formed on the semiconductor substrate 101 via the underlying insulator 102. The gate insulator 104 is formed on side surfaces and an upper surface of the gate electrode 103. The underlying insulator 102, the gate electrode 103, and the gate insulator 104 are, for example, a silicon oxide film, a polysilicon electrode, and a silicon oxide film, respectively.

The semiconductor device of FIG. 1 further includes a stacked layer in which a drain layer 111, an intermediate layer 112, and a source layer 113 are successively stacked on the semiconductor substrate 101. The stacked layer is formed on the side surfaces and the upper surface of the gate electrode 103 via the gate insulator 104, as illustrated in FIG. 1. The drain layer 111 and the source layer 113 are examples of lower and upper main terminal layers, respectively.

In the present embodiment, the drain layer 111, the intermediate layer 112, and the source layer 113 are an n+ type layer, an i type (intrinsic type) layer, and a p+ type layer, respectively. The n type and the p type are examples of first and second conductivity types, respectively. The intermediate layer 112 may be an n type layer instead of an i type layer.

The semiconductor device of FIG. 1 further includes a semiconductor layer 114 which is an n+ type layer. In the present embodiment, the source layer 113 is formed on the side surfaces and the upper surface of the gate electrode 103 via the gate insulator 104 and the semiconductor layer 114. The semiconductor layer 114 has the same functions as those of the above-described n type shallow region. The semiconductor layer 114 may be an i type layer instead of an n+ type layer.

In the present embodiment, the drain layer 111, the intermediate layer 112, and the source layer 113 are formed on the upper surface and X-directional side surfaces of the gate electrode 103. In addition, an isolation insulator 121 illustrated in FIG. 1 surrounds the X- and Y-directional side surfaces of the gate electrode 103 and the layers 111 to 113. The isolation insulator 121 is, for example, a silicon oxide film.

(1) Details of Tunnel FET

As described above, the tunnel FET illustrated in FIG. 1 is a vertical FET in which the drain layer 111 and the source layer 113 are vertically stacked. Hereafter, the structure and operation of this tunnel FET will be described in detail.

In the present embodiment, the drain layer 111 and the source layer 113 are an n+ type layer and a p+ type layer, respectively, and the tunnel FET illustrated in FIG. 1 is an n type FET. In addition, the intermediate layer 112 is an i type layer, and the drain layer 111, the intermediate layer 112, and the source layer 113 constitute a PIN-type diode.

When a predetermined positive voltage is applied to the gate electrode 103, a tunnel current flows between an inversion layer arising in the semiconductor layer 114 and the source layer 113, and therefore, an on-current is obtained. This tunnel current mainly flows through a region between each side surface of the gate electrode 103 and each side surface of the source layer 113. Accordingly, in the present embodiment, the on-current can be increased, without increasing a substrate area occupied by the tunnel FET, by increasing the height of the gate electrode 103 and thereby widening this region.

When a voltage is not applied to the gate electrode 103, only an off-current dependent on the abovementioned PIN-type diode flows as a tunnel current. Accordingly, in the present embodiment, the off-current remains not increased if the occupied substrate area is not increased. In addition, the off-current can be reduced, without increasing the occupied substrate area, by thickening the intermediate layer 112.

Consequently, according to the present embodiment, it is possible to increase a ratio between the on-current and the off-current of the tunnel FET and an on-current per unit substrate area.

In the present embodiment, the tunnel FET may be changed to a p type FET by replacing the drain layer 111 and the source layer 113 with a p+ type layer and an n+ type layer, respectively. In this case, the intermediate layer 112 is formed of an i type layer or a p type layer, and the semiconductor layer 114 is formed of a p+ type layer or an i type layer.

In the present embodiment, the drain layer 111, the intermediate layer 112, the source layer 113, and the semiconductor layer 114 are all silicon layers. Alternatively, these layers may be formed of a semiconductor layer other than a silicon layer. For example, the source layer 113 may be an SiGe (silicon germanium) layer or an InAs (indium arsenic) layer.

(2) Modified Examples of First Embodiment

Next, a semiconductor device of modified examples of the first embodiment will be described with reference to FIGS. 2 and 3.

Figure 2:
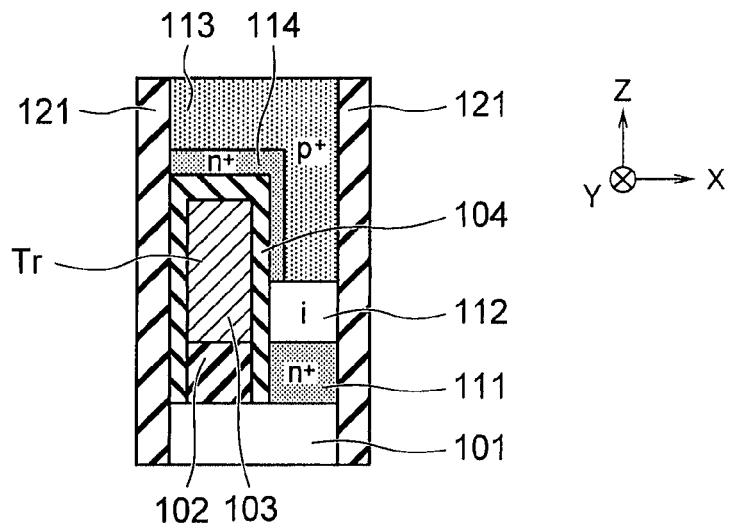
FIGS. 2 and 3 are cross-sectional views illustrating structures of the semiconductor device of modified examples of the first embodiment.
Figure 3:
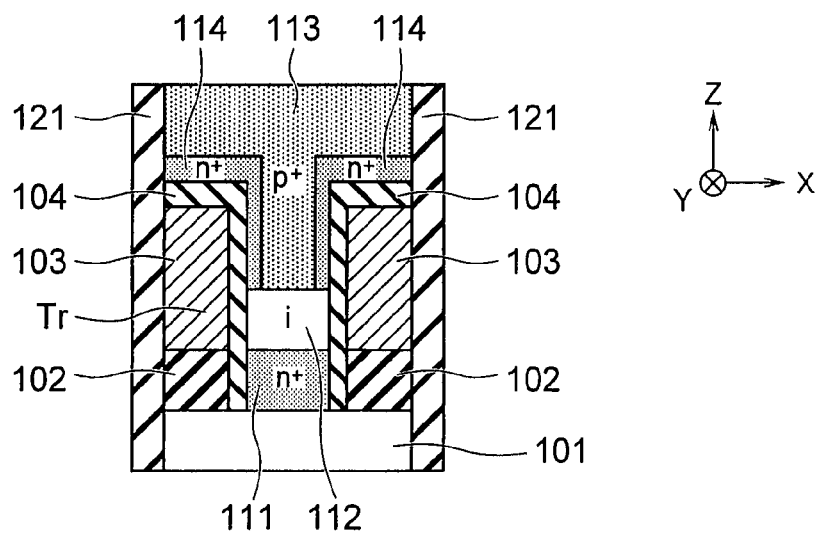

FIGS. 2 and 3 are cross-sectional views illustrating structures of the semiconductor device of the modified examples of the first embodiment.

In FIG. 2, a drain layer 111, an intermediate layer 112, and a source layer 113 are formed on an upper surface and one X-directional side surface of a gate electrode 103. In the present embodiment, a structure illustrated in FIG. 2 may be adopted in place of the structure illustrated in FIG. 1. The structure illustrated in FIG. 1 has an advantage, however, that a region in which a tunnel current of the tunnel FET flows is approximately doubled in size, compared with the structure illustrated in FIG. 2.

In FIG. 3, the gate electrode 103 has a cylindrical planar shape when viewed from above the semiconductor substrate 101. In addition, a stacked layer in which the drain layer 111, the intermediate layer 112 and the source layer 113 are successively stacked is buried in this cylinder. As a result, this stacked layer is formed on the side surfaces and the upper surface of the gate electrode 103 via the gate insulator 104. In the present embodiment, the structure illustrated in FIG. 3 may be adopted in place of the structure illustrated in FIG. 1. Note however that the structure illustrated in FIG. 1 has an advantage that the tunnel current flows easily and that the gate electrode 103 is easy to fabricate, compared with the structure illustrated in FIG. 3.

(3) Method of Manufacturing Semiconductor Device of First Embodiment

Next, a method of manufacturing the semiconductor device of the first embodiment will be described with reference to FIGS. 4A to 5C.

FIGS. 4A to 5C are cross-sectional views illustrating the method of manufacturing the semiconductor device of the first embodiment.

Figure 4A:
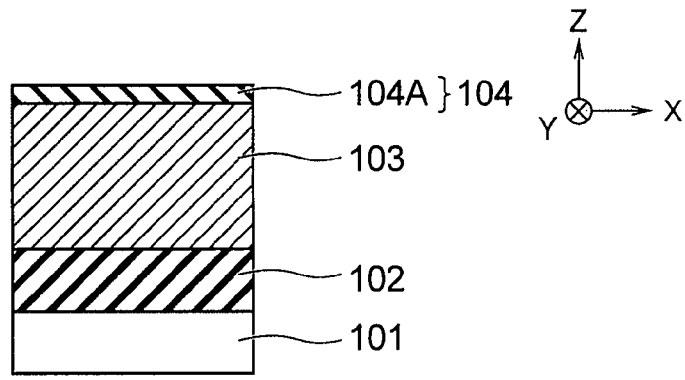
FIGS. 4A to 5C are cross-sectional views illustrating a method of manufacturing the semiconductor device of the first embodiment.

First, as illustrated in FIG. 4A, an insulating material to serve as the underlying insulator 102, an electrode material to serve as the gate electrode 103, and an insulating material 104A to serve as part of the gate insulator 104 are successively deposited on the semiconductor substrate 101. However, the insulating material to serve as the underlying insulator 102 may be formed by thermal oxidation instead of deposition processing. In addition, in the present embodiment, the insulating material 104A is a silicon nitride film.

Figure 4B:
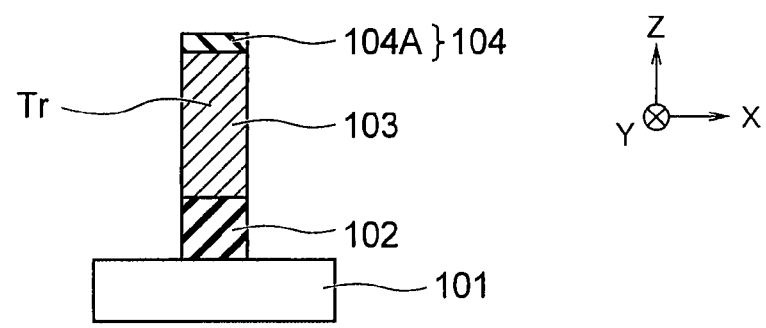

Next, as illustrated in FIG. 4B, these deposition materials are etched by lithography and RIE (Reactive Ion Etching) to form the underlying insulator 102, the gate electrode 103, and part of the gate insulator 104.

Figure 4C:
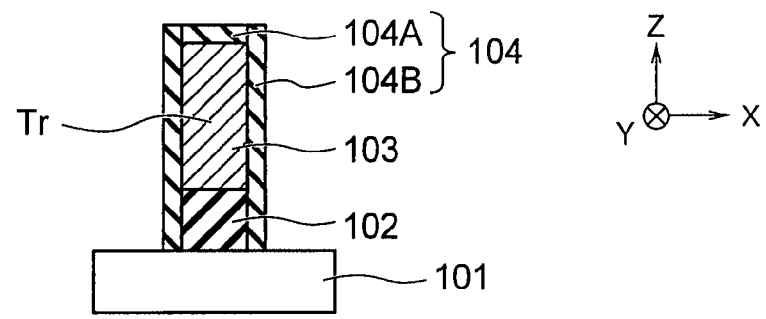

Next, an insulating material 104B to serve as part of the gate insulator 104 is deposited on an entire surface of the semiconductor substrate 101 (FIG. 4C). In the present embodiment, the insulating material 104B is a silicon oxide film. Next, the insulating material 104B is removed from the surface of the semiconductor substrate 101 by RIE to expose the surface of the semiconductor substrate 101 (FIG. 4C). At this time, the insulating material 104A on the upper surface of the gate electrode 103 is not removed, and therefore, the upper surface of the gate electrode 103 remains covered with the insulating material 104A. In this way, the gate insulator 104 is formed on the side surfaces and the upper surface of the gate electrode 103, as illustrated in FIG. 4C.

Figure 5A:
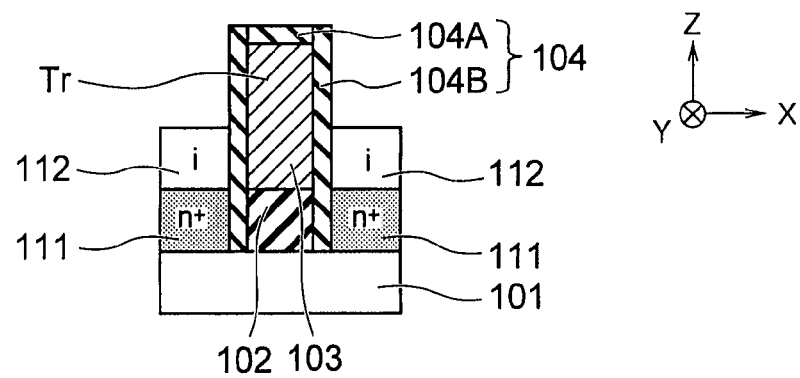

Next, as illustrated in FIG. 5A, the drain layer 111 which is an n+ type layer and the intermediate layer 112 which is an i type layer are successively formed by selective epitaxial growth on the side surfaces of the gate electrode 103 on the semiconductor substrate 101.

Figure 5B:
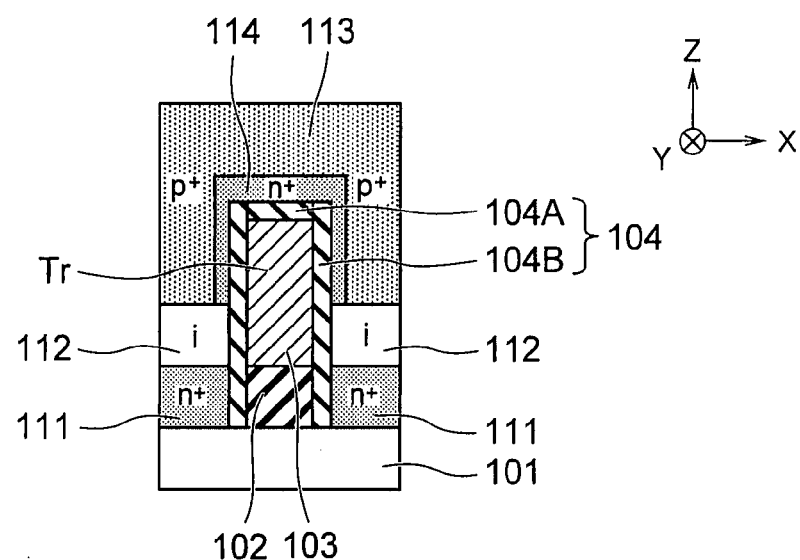

Next, an n+ type amorphous Si layer to serve as the semiconductor layer 114 is deposited on the entire surface of the semiconductor substrate 101 (FIG. 5B). Next, the n+ type amorphous Si layer is crystallized by SPE (Solid Phase Epitaxy). Next, this n+ type layer is removed from the upper surface of the intermediate layer 112 by RIE to expose the upper surface of the intermediate layer 112 (FIG. 5B). In this way, the semiconductor layer 114 is formed on the side surfaces and the upper surface of the gate electrode 103 via the gate insulator 104, as illustrated in FIG. 5B.

Next, as illustrated in FIG. 5B, the source layer 113 which is a p+ type layer is deposited on the entire surface of the semiconductor substrate 101. The source layer 113 may be either a monocrystalline Si layer or a polycrystalline Si layer. In addition, like the semiconductor layer 114, the source layer 113 may be formed by crystallizing a p+ type amorphous Si layer. It is desirable, however, that an impurity concentration gradient between the source layer 113 which is a p+ type layer and the semiconductor layer 114 which is an n+ type layer is steep.

Figure 5C:
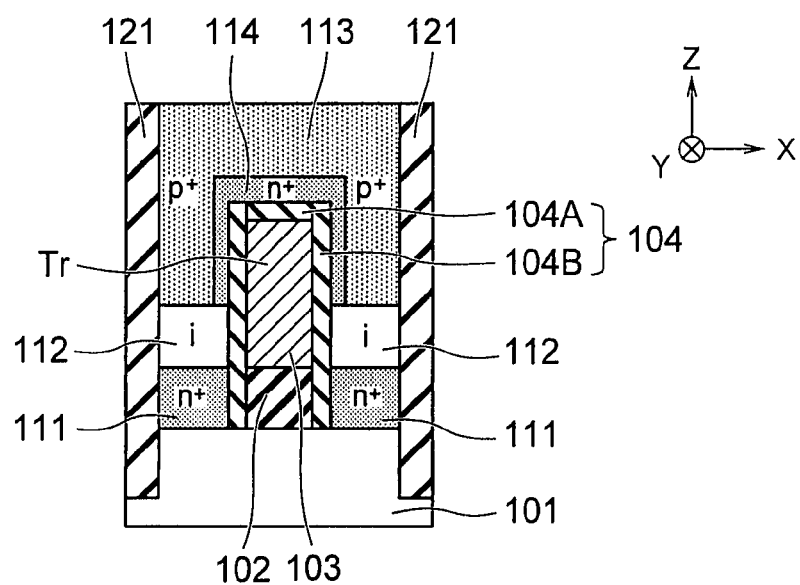

Next, an isolation trench for the isolation insulator 121 is formed by RIE in the source layer 113, the intermediate layer 112, the drain layer 111, and the semiconductor substrate 101 (FIG. 5C). Next, an insulating material is buried in the isolation trench, and surfaces of this insulating material are planarized by CMP (Chemical Mechanical Polishing) (FIG. 5C). As a result, the isolation insulator 121 is formed as illustrated in FIG. 5C.

Thereafter, in the present embodiment, an interconnect layer, a via plug, an interlayer dielectric and the like are formed by an existing method. In this way, the semiconductor device of FIG. 1 is manufactured.

(4) Effects of First Embodiment

Finally, effects of the first embodiment will be described.

As described above, the tunnel FET of the present embodiment includes the stacked layer in which the n+ type drain layer 111, the i type or n type intermediate layer 112, and the p+ type source layer 113 are successively stacked. This stacked layer is formed on the side surfaces of the gate electrode 103 via the gate insulator 104.

Accordingly, in the present embodiment, an on-current can be increased, without increasing the occupied substrate area of the tunnel FET, by increasing the height of the gate electrode 103. In addition, in the present embodiment, an off-current can be reduced, without increasing the occupied substrate area, by thickening the intermediate layer 112. Additionally, in the present embodiment, the off-current is kept from increasing if the occupied substrate area is not increased, as described above.

Consequently, according to the present embodiment, it is possible to increase a ratio between the on-current and the off-current of the tunnel FET and an on-current per unit substrate area.

Hereinafter, a description will be given of second to eighth embodiments which are modified examples of the first embodiment. The second to eighth embodiments will be described with a focus on the differences thereof from the first embodiment.

(Second Embodiment)

Figure 6A:
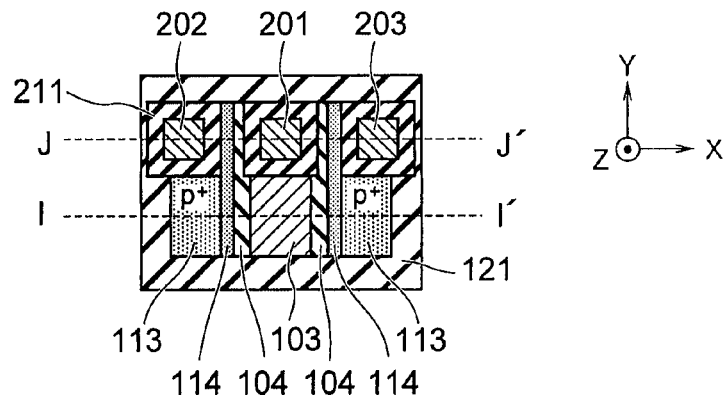
FIGS. 6A to 6C are cross-sectional views illustrating a structure of a semiconductor device of a second embodiment.
Figure 6B:
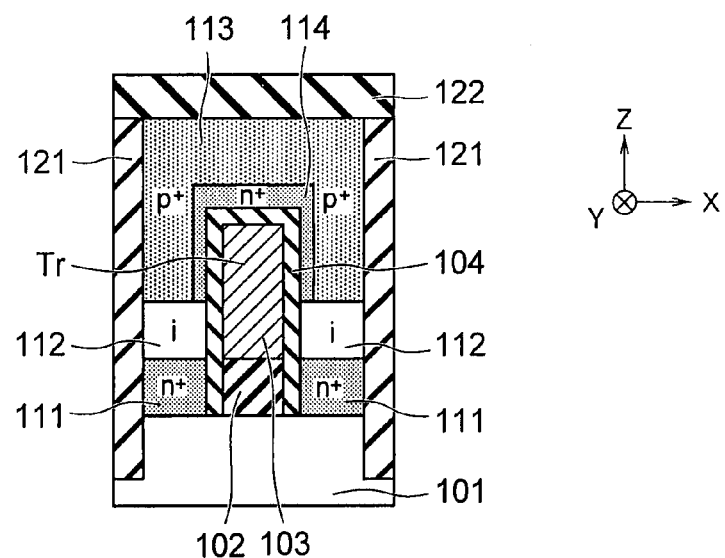
Figure 6C:
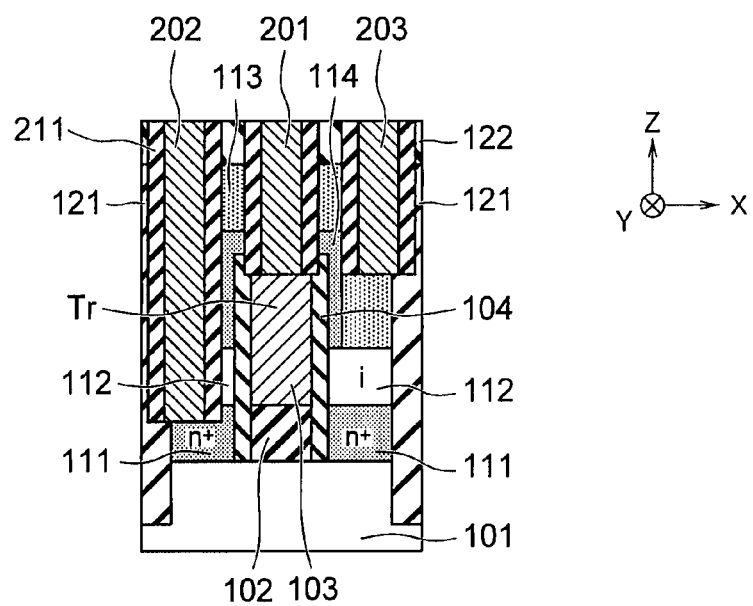

FIGS. 6A to 6C are cross-sectional views illustrating a structure of a semiconductor device of the second embodiment.

FIG. 6A is a cross-sectional view taken by cutting the semiconductor device along a cross section perpendicular to a Z direction. In addition, FIGS. 6B and 6C are cross-sectional views taken along lines I-I' and J-J', respectively, shown in FIG. 6A.

The semiconductor device of the present embodiment includes an interlayer dielectric 122 formed on the source layer 113 and the isolation insulator 121, a contact plug 201 for the gate electrode 103, a contact plug 202 for the drain layer 111, a contact plug 203 for the source layer 113, and an insulating layer 211, in addition to the components illustrated in FIG. 1.

Side surfaces of the contact plugs 201 to 203 are covered with the insulating layer 211, and bottom surfaces of the contact plugs are positioned on the gate electrode 103, the drain layer 111, and the source layer 113, respectively, as illustrated in FIGS. 6A to 6C. Consequently, these contact plugs 201 to 203 are electrically connected to the gate electrode 103, the drain layer 111, and the source layer 113, respectively.

The contact plugs 201 to 203 can be formed by, for example, a method described below.

First, after a step shown in FIG. 5C, the interlayer dielectric 122 is formed on the entire surface of the semiconductor substrate 101. Next, contact holes for the contact plugs 201 and 203 are formed by RIE. Next, a contact hole for the contact plug 202 is formed by RIE. The reason for forming these contact holes in twice by RIE processing is that the former contact holes and the latter contact hole differ in depth.

Next, the insulating layer 211 is deposited on side surfaces and bottom surfaces of these contact holes. The insulating layer 211 is, for example, a silicon oxide film. Next, the insulating layer 211 is removed from the bottom surfaces of the contact holes by etching. Next, an interconnect material is buried in the contact holes. In this way, the contact plugs 201 to 203 are formed.

(1) Modified Example of Second Embodiment

Next, a semiconductor device of a modified example of the second embodiment will be described with reference to FIG. 7.

Figure 7:
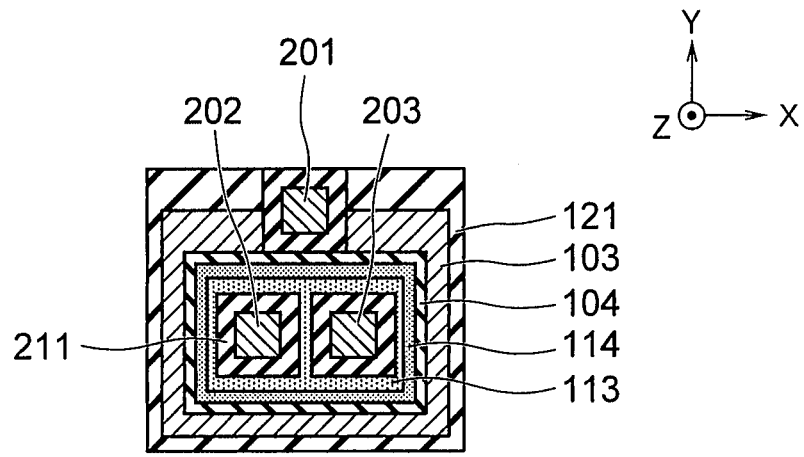
FIG. 7 is a cross-sectional view illustrating a structure of the semiconductor device of a modified example of the second embodiment.

FIG. 7 is a cross-sectional view illustrating a structure of the semiconductor device of the modified example of the second embodiment.

The semiconductor device of FIG. 7 has the same structure as that of the semiconductor device of FIG. 3, whereas the semiconductor device in FIGS. 6A to 6C has the same structure as that of the semiconductor device of FIG. 1. FIG. 7 differs from FIGS. 6A to 6C in the layout of the gate electrode 103, the drain layer 111 and the source layer 113. Accordingly, a layout of the contact plugs 201 to 203 different from the layout illustrated in FIGS. 6A to 6C is adopted in FIG. 7.

(2) Effects of Second Embodiment

Finally, effects of the second embodiment will be described.

As described above, in the present embodiment, the contact plugs 201 to 203 the side surfaces of which are covered with the insulating layer 211 are formed on the gate electrode 103, the drain layer 111, and the source layer 113, respectively. Consequently, according to the present embodiment, the contact plugs 201 to 203 can be electrically connected to the gate electrode 103, the drain layer 111, and the source layer 113, respectively, without short-circuiting the contact plugs to any other layers.

(Third Embodiment)

Figure 8:
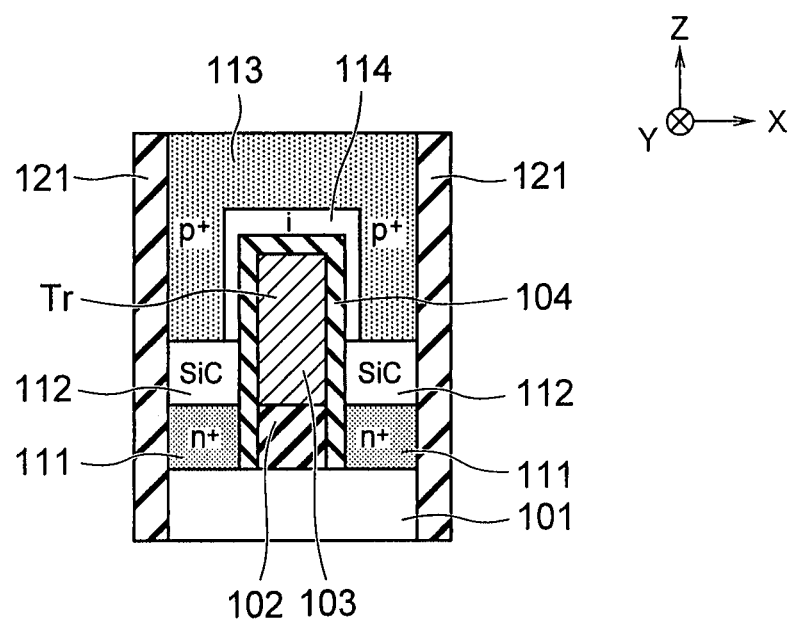
FIG. 8 is a cross-sectional view illustrating a structure of a semiconductor device of a third embodiment.

FIG. 8 is a cross-sectional view illustrating a structure of a semiconductor device of a third embodiment.

In the present embodiment, an intermediate layer 112 is formed of a material having a wider bandgap than silicon. Forming the intermediate layer 112 by using such a material has an advantage of being able to reduce an off-current without changing the dimensions of the semiconductor device.

Examples of such a material include SiC (silicon carbide). An SiC layer has an advantage of being easy to be epitaxially grown on a silicon substrate.

In addition, in the present embodiment, the source layer 113 is formed of a material having a narrower bandgap than silicon. Forming the source layer 113 by using such a material has an advantage of being able to increase an on-current without changing the dimensions of the semiconductor device. Examples of such a material include SiGe, Ge, InAs and InGaAs.

The on-current can be controlled between the source layer 113 and the semiconductor layer 114, and the off-current can be controlled between the drain layer 111 and the intermediate layer 112. Consequently, in the present embodiment, both the increase of the on-current and the decrease of the off-current can be realized at the same time by forming the intermediate layer 112 and the source layer 113 by using the above-described materials, respectively.

(Fourth Embodiment)

Figure 9A:
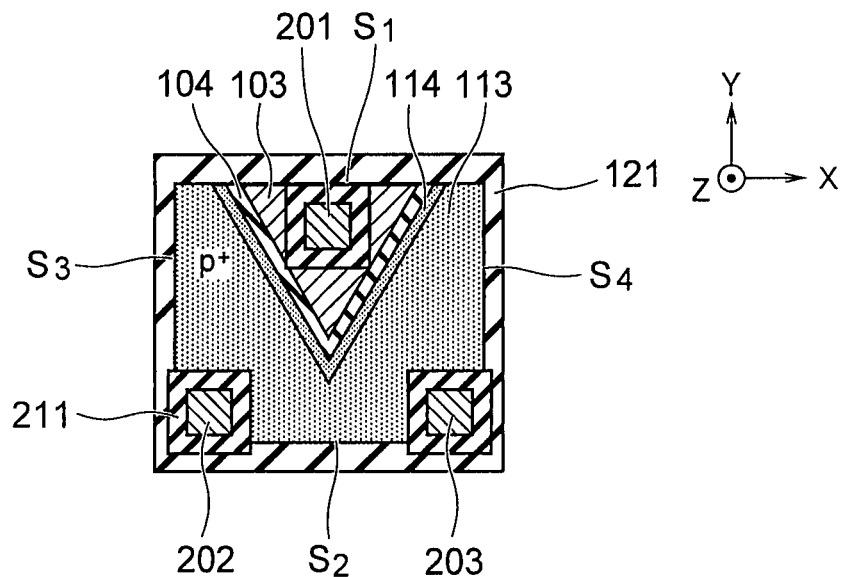
FIGS. 9A and 9B are cross-sectional views illustrating structures of a semiconductor device of a fourth embodiment.
Figure 9B:
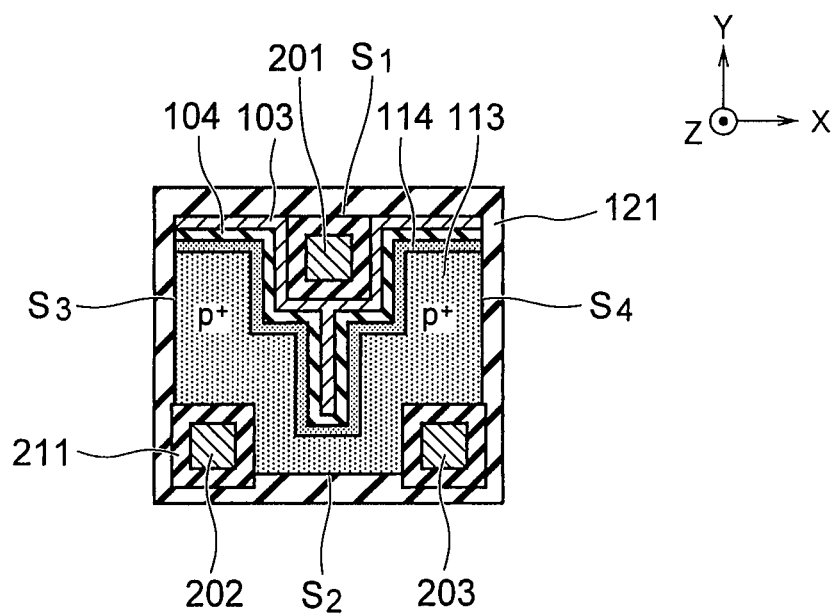

FIGS. 9A and 9B are cross-sectional views illustrating structures of a semiconductor device of a fourth embodiment. FIGS. 9A and 9B are cross-sectional views taken by cutting the semiconductor device along a cross section (horizontal cross section) perpendicular to the Z direction.

The structure illustrated in FIG. 9A is a modified example of the structure illustrated in FIG. 6A. In FIG. 9A, a gate electrode 103 has a triangular planar shape and one side thereof contacts an inner wall surface $S_1$ of an isolation insulator 121. On the other hand, a source layer 113 contacts inner wall surfaces $S_2$ to $S_4$ of the isolation insulator 121.

In the structure illustrated in FIG. 9A, the radius of an inscribed circle in a horizontal cross section of the gate electrode 103 is large, compared with the structure illustrated in FIG. 6A. Likewise, in the structure illustrated in FIG. 9A, the radius of an inscribed circle in a horizontal cross section of the source layer 113 and the radius of an inscribed circle in a horizontal cross section of the drain layer 111 are also large, compared with the structure illustrated in FIG. 6A. As a result, according to the present embodiment, a margin of misalignment of the contact plugs 201 to 203 is made larger.

In addition, according to the present embodiment, a boundary line between the gate electrode 103 and the source layer 113 in a horizontal cross section of the semiconductor device becomes longer. Consequently, according to the present embodiment, it is possible to obtain a larger on-current.

In FIG. 9A, the gate electrode 103 is, for the most part, positioned in the vicinity of the inner wall surface $S_1$. On the other hand, the source layer 113 is, for the most part, positioned in the vicinity of the inner wall surface $S_2$, and so is the drain layer 111. Accordingly, in FIG. 9A, the contact plug 201 is located on the inner wall surface $S_1$ side and the contact plugs 202 and 203 are located on the inner wall surface $S_2$ side. The contact plug 201 is an example of a first contact plug, and the contact plugs 202 and 203 are examples of second contact plugs.

In addition, in the present embodiment, the structure illustrated in FIG. 9B may be adopted in place of the structure illustrated in FIG. 9A. In both FIGS. 9A and 9B, the gate electrode 103 is thickened in planar shape in the vicinity of the contact plug 201, and therefore, a margin of misalignment of the contact plug 201 is made larger.

As described above, according to the present embodiment, it is possible to increase a margin of misalignment of the contact plugs 201 to 203.

(Fifth Embodiment)

Figure 10A:
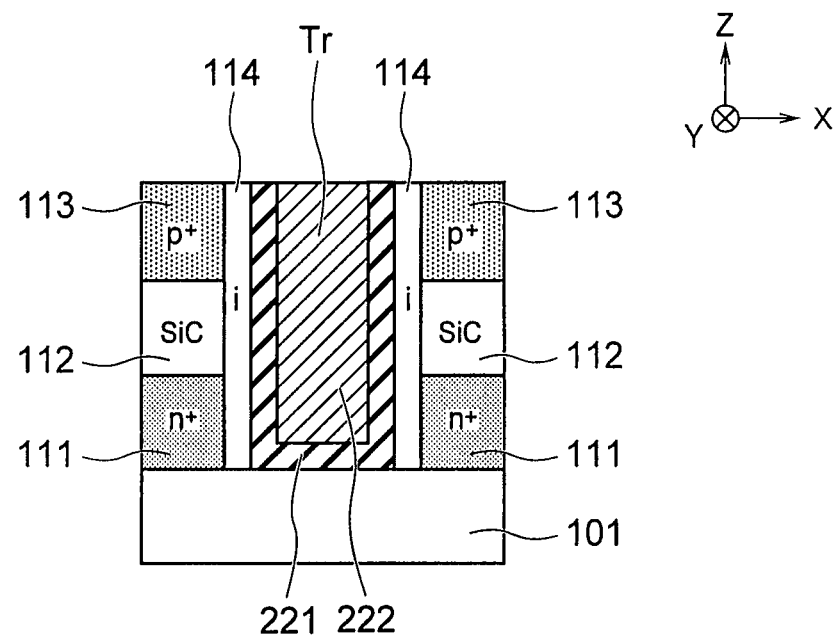
FIGS. 10A and 10B are cross-sectional views illustrating structures of a semiconductor device of a fifth embodiment.
Figure 10B:
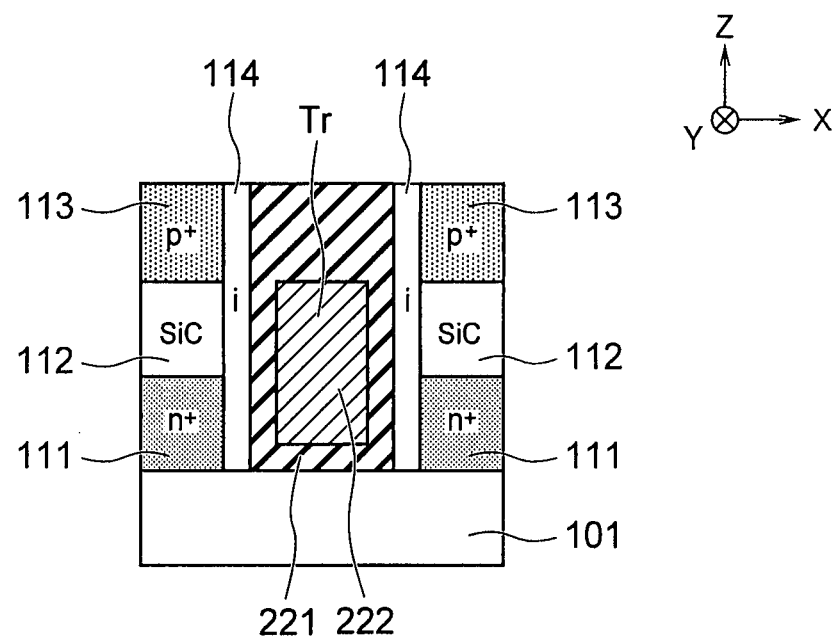

FIGS. 10A and 10B are cross-sectional views illustrating structures of a semiconductor device of a fifth embodiment.

The semiconductor device of FIG. 10A includes a semiconductor substrate 101, a gate insulator 221, and a gate electrode 222. The gate insulator 221 has such a shape as formed by combining the underlying insulator 102 and the gate insulator 104 in FIG. 1, and is formed on side surfaces and a bottom surface of the gate electrode 222.

In addition, like the semiconductor device of FIG. 1, the semiconductor device of FIG. 10A includes a stacked layer in which a drain layer 111, an intermediate layer 112 and a source layer 113 are successively stacked, and a semiconductor layer 114. In FIG. 10A, however, the whole of the stacked layer is formed on the side surfaces of the gate electrode 222 via the gate insulator 221 and the semiconductor layer 114. Consequently, in FIG. 10A, the semiconductor layer 114 is formed not only on the side surfaces of the source layer 113 but also on the side surfaces of the drain layer 111 and the intermediate layer 112.

As a result, if a gate voltage is set equal to or higher than a certain voltage with the potential of the p+ type layer 113 kept higher than that of the n+ type layer 111, a tunnel current flows between the p+ type layer 113 and the i type layer 114. Consequently, the tunnel FET of FIG. 10A operates as an nFET with the p+ type layer 113 serving as a source. Conversely, if the gate voltage is set lower than the certain voltage, a tunnel current flows between the n+ type layer 111 and the i type layer 114. Consequently, the tunnel FET of FIG. 10A operates as a pFET with the n+ type layer 111 serving as a source. Consequently, according to the present embodiment, it is possible to form a CMOS circuit using an nFET and a pFET.

If the above-described tunnel FET is operated as a pFET alone, the structure illustrated in FIG. 10B may be adopted in place of the structure illustrated in FIG. 10A. In FIG. 10B, the gate insulator 221 is also formed on an upper surface of the gate electrode 222. Accordingly, the upper surface of the gate electrode 222 is almost level with the upper surface of the intermediate layer 112. In FIG. 10B, the gate electrode 222 is not present on the side surfaces of the source layer 113. Consequently, the tunnel FET does not operate as an nFET in which a tunnel current between the source layer 113 and the semiconductor layer 114 is controlled by the gate electrode 222.

Figure 11A:
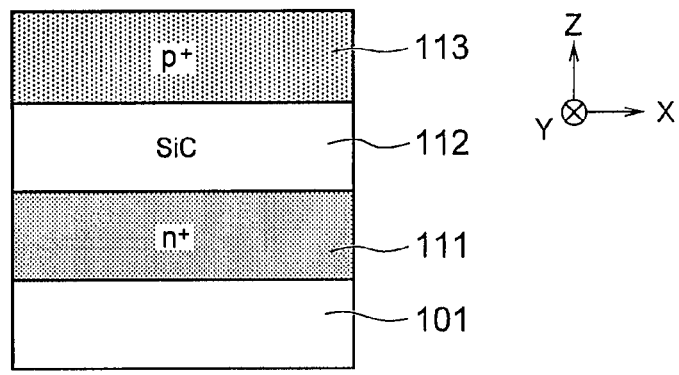
FIGS. 11A to 11C are cross-sectional views illustrating a method of manufacturing the semiconductor device of the fifth embodiment.
Figure 11B:
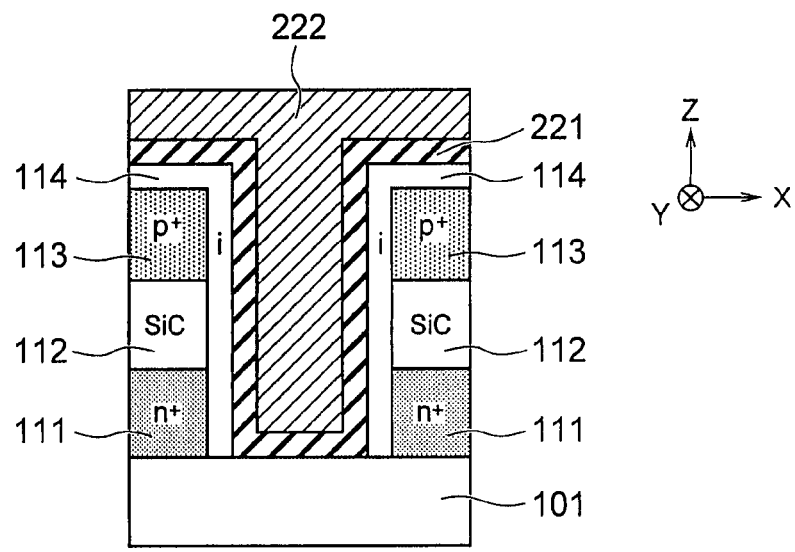
Figure 11C:
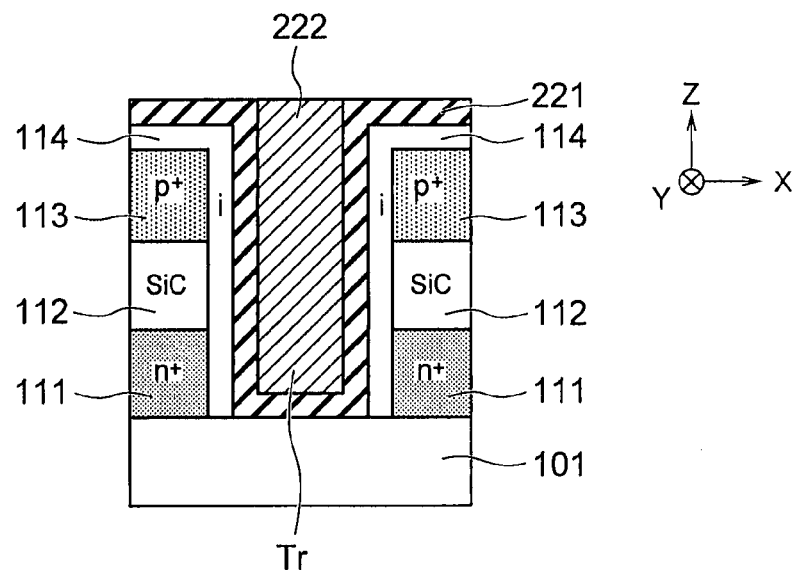

FIGS. 11A to 11C are cross-sectional views illustrating a method of manufacturing the semiconductor device of the fifth embodiment.

First, as illustrated in FIG. 11A, the drain layer 111, the intermediate layer 112 and the source layer 113 are successively deposited on the semiconductor substrate 101.

Next, a hole for the gate electrode 222 is created by lithography and RIE in the source layer 113, the intermediate layer 112 and the drain layer 111 (FIG. 11B). Next, an i type amorphous Si layer to serve as the semiconductor layer 114 and an insulating material to serve as the gate insulator 221 are successively formed on the entire surface of the semiconductor substrate 101 (FIG. 11B). Next, the i type amorphous Si layer is crystallized by SPE. Next, an electrode material to serve as the gate electrode 222 is formed on the entire surface of the semiconductor substrate 101 (FIG. 11B). The electrode material is set to such a thickness as to fill the abovementioned hole.

Next, as illustrated in FIG. 11C, surfaces of this electrode material are planarized by CMP.

Thereafter, in the present embodiment, an interconnect layer, a via plug, an interlayer dielectric and the like are formed by an existing method. In this way, the semiconductor device of FIG. 10A is manufactured.

As described above, the tunnel FET of the present embodiment includes the stacked layer in which the n+ type drain layer 111, the i type or n type intermediate layer 112, and the p+ type source layer 113 are successively stacked, as that of the first embodiment. This stacked layer is formed on the side surfaces of the gate electrode 222 via the gate insulator 221.

Consequently, according to the present embodiment, it is possible to increase a ratio between the on-current and the off-current of the tunnel FET and an on-current per unit substrate area, as in the first embodiment.

In the present embodiment, the source layer 113 is stacked above the drain layer 111. Alternatively, the drain layer 111 may be stacked above the source layer 113.

(Sixth Embodiment)

Figure 12A:
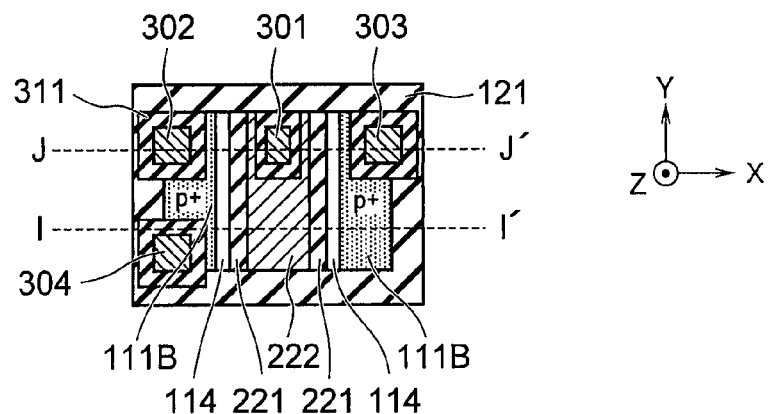
FIGS. 12A to 12C are cross-sectional views illustrating a structure of a semiconductor device of a sixth embodiment.
Figure 12B:
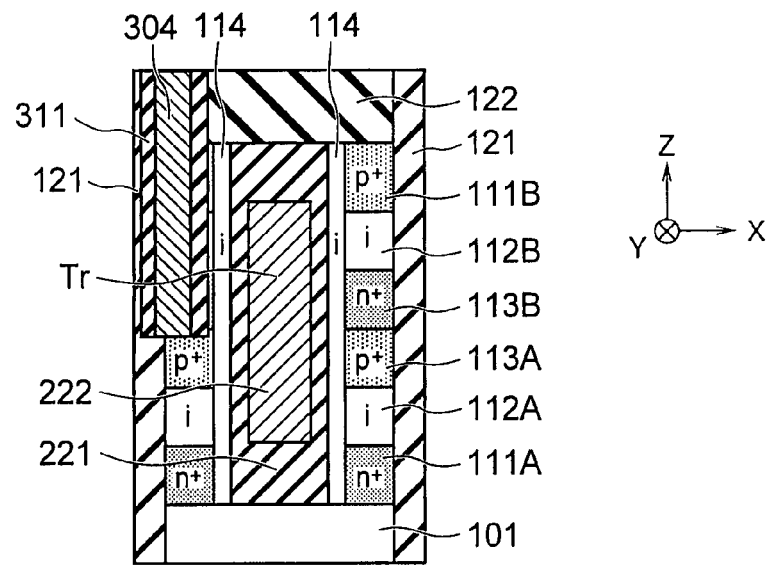
Figure 12C:
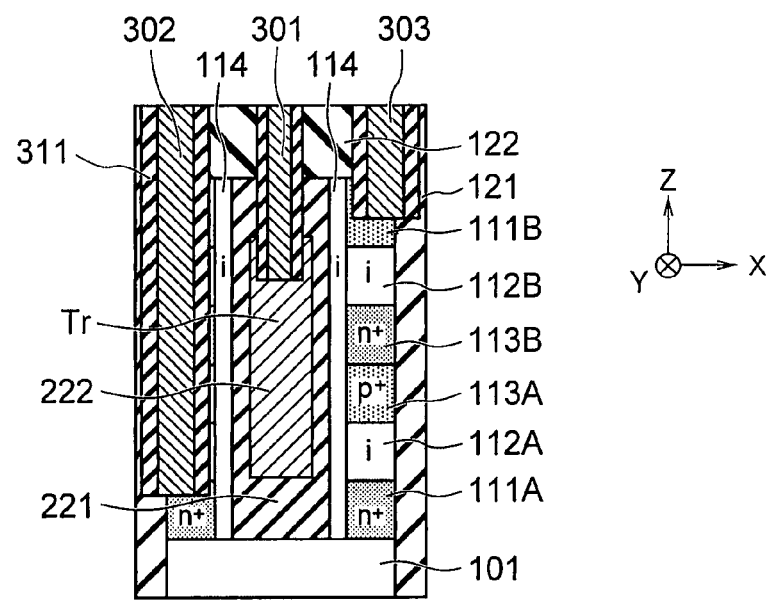

FIGS. 12A to 12C are cross-sectional views illustrating a structure of a semiconductor device of a sixth embodiment.

FIG. 12A is a cross-sectional view taken by cutting the semiconductor device along a cross section perpendicular to the Z direction. In addition, FIGS. 12B and 12C are cross-sectional views taken along lines I-I' and J-J', respectively, shown in FIG. 12A.

The semiconductor device illustrated in FIGS. 12A to 12C includes a semiconductor substrate 101, a gate insulator 221, and a gate electrode 222. The semiconductor device is the same as the semiconductor device illustrated in FIGS. 10A and 10B.

The semiconductor device illustrated in FIGS. 12A to 12C further includes a stacked layer in which a first drain layer 111A, a first intermediate layer 112A, a first source layer 113A, a second source layer 113B, a second intermediate layer 112B, and a second drain layer 111B are successively stacked on the semiconductor substrate 101. This stacked layer is formed on the side surfaces of the gate electrode 222 via the gate insulator 221, as illustrated in FIGS. 12A to 12C.

In the present embodiment, the first drain layer 111A, the first intermediate layer 112A, and the first source layer 113A are an n+ type layer, an i type layer, and a p+ type layer, respectively. Likewise, the second source layer 113B, the second intermediate layer 112B, and the second drain layer 111B are an n+ type layer, an i type layer, and a p+ type layer, respectively. The first intermediate layer 112A may be an n type layer instead of an i type layer. In addition, the second intermediate layer 112B may be a p type layer instead of an i type layer.

The first drain layer 111A, the first source layer 113A, the second source layer 113B, and the second drain layer 111B are examples of a first lower main terminal layer, a first upper main terminal layer, a second lower main terminal layer, and a second upper main terminal layer, respectively.

The semiconductor device illustrated in FIGS. 12A to 12C further includes a semiconductor layer 114 which is an i type layer. In the present embodiment, the whole of the above-described stacked layer is formed on the side surfaces of the gate electrode 222 via the gate insulator 221 and the semiconductor layer 114. Consequently, in the present embodiment, the semiconductor layer 114 is formed on the side surfaces of the first drain layer 111A, the first intermediate layer 112A, the first source layer 113A, the second source layer 113B, the second intermediate layer 112B, and the second drain layer 111B.

The semiconductor device illustrated in FIGS. 12A to 12C further includes an isolation insulator 121, an interlayer dielectric 122, contact plugs 301 to 304, and an insulating layer 311.

The side surfaces of the contact plugs 301 to 304 are covered with the insulating layer 311, and the bottom surfaces of the contact plugs are positioned on the gate electrode 222, the first drain layer 111A, the second drain layer 111B, and the first source layer 113A, respectively, as illustrated in FIGS. 12A to 12C. Consequently, these contact plugs 301 to 304 are electrically connected to the gate electrode 222, the first drain layer 111A, the second drain layer 111B, and the first source layer 113A, respectively. In the present embodiment, the first source layer 113A and the second source layer 113B are electrically connected to an interconnect layer via the same silicide region, and are at the same potential.

In the present embodiment, the main terminal layers 111A, 113A, 113B and 111B may be a p+ type layer, an n+ type layer, a p+ type layer, and an n+ type layer, respectively.

(1) Details of Tunnel FET

In FIGS. 12A to 12C, an n type tunnel FET (n type tFET) is configured by using the first drain layer 111A, the first intermediate layer 112A, the first source layer 113A, the semiconductor layer 114, the gate insulator 221, and the gate electrode 222.

In addition, a p type tunnel FET (p type tFET) is configured by using the second source layer 113B, the second intermediate layer 112B, the second drain layer 111B, the semiconductor layer 114, the gate insulator 221, and the gate electrode 222.

Hereinafter, the structure and operation of these tFETs will be described in detail.

In FIGS. 12A to 12C, the n type tFET and the p type tFET are vertically stacked, and these tFET share the same gate electrode 222. In addition, as described above, the first source layer 113A and the second source layer 113B are at the same potential.

Accordingly, if a ground potential, a power supply voltage and a ground potential are supplied to the first drain layer 111A, the second drain layer 111B, and the gate electrode 222, respectively, the potentials of the first and second source layers 113A and 113B equal the power supply voltage.

On the other hand, if a ground potential, a power supply voltage, and a positive voltage equal to or higher than a threshold voltage are supplied to the first drain layer 111A, the second drain layer 111B, and the gate electrode 222, respectively, the potentials of the first and second source layers 113A and 113B equal the ground potential.

As described above, the n type tFET and the p type tFET illustrated in FIGS. 12A to 12C constitute a CMOS inverter circuit (NOT gate). The heights of the first source layer 113A and the second source layer 113B may be adjusted, in order to equalize the on-currents of the n type tFET and the p type tFET for the operation of the inverter circuit.

As described above, in the present embodiment, a CMOS circuit is fabricated by vertically stacking the n type tFET and the p type tFET on the semiconductor substrate 101. The CMOS circuit can also be fabricated, however, by a method of forming the n type tFET and the p type tFET in separate regions on the semiconductor substrate 101, in addition to this method.

Hereinafter, the former CMOS circuit is referred to as a stacked CMOS and the latter CMOS circuit is referred to as a non-stacked CMOS, in order to compare these CMOS circuits.

The non-stacked CMOS has the below-described disadvantages. First, since the n type tFET and the p type tFET are individually formed in separate regions, the number of manufacturing steps, including a lithography step, increases, thereby complicating a manufacturing process. Second, since a deposition step, such as a selective epitaxial growth, is carried out on such segmentalized regions, it is difficult to ensure the uniformity of deposited films.

On the other hand, the stacked CMOS has the below-described advantages. First, since there is no need to individually form the n type tFET and the p type tFET in separate regions, the number of manufacturing steps, including a lithography step, is kept small. Second, since a deposition step, such as selective epitaxial growth, is carried out on a wide region, the controllability of a deposition process is excellent. Accordingly, the stacked CMOS can be manufactured at low costs, compared with the non-stacked CMOS. In addition, since the n type tFET and the p type tFET are vertically stacked in the stacked CMOS, the stacked CMOS can be fabricated in approximately a half occupied substrate area, compared with the non-stacked CMOS.

As described above, according to the present embodiment, it is possible to reduce the manufacturing cost of a CMOS circuit and cut down the occupied substrate area thereof.

In the present embodiment, the p type tFET is stacked on the n type tFET, a ground potential is supplied to the first drain layer 111A, and a power supply voltage is supplied to the second drain layer 111B. Alternatively, the n type tFET may be stacked on the p type tFET. In this case, the main terminal layers 111A, 113A, 113B and 111B are formed of a p+ type layer, an n+ type layer, a p+ type layer, and an n+ type layer, respectively, a power supply voltage is supplied to the main terminal layer 111A, and a ground potential is supplied to the main terminal layer 111B.

(2) Modified Examples of Sixth Embodiment

Next, modified examples of the sixth embodiment will be described with reference to FIGS. 13 and 14.

Figure 13:
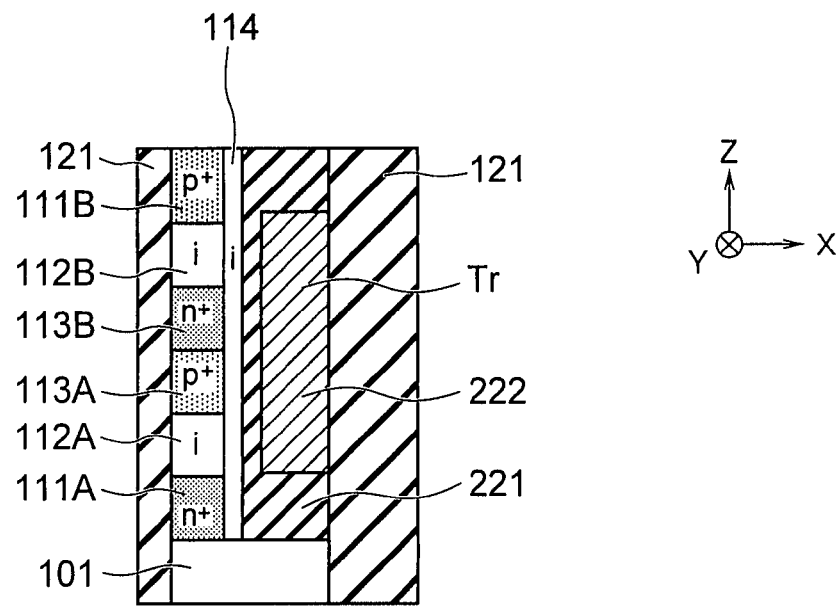
FIGS. 13 and 14 are cross-sectional views illustrating structures of the semiconductor device of modified examples of the sixth embodiment.
Figure 14:
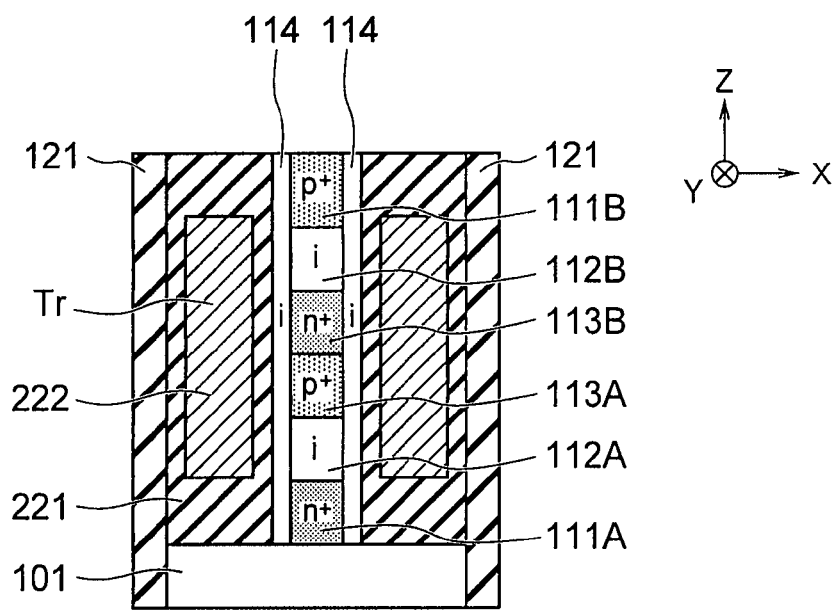

FIGS. 13 and 14 are cross-sectional views illustrating structures of the semiconductor device of the modified examples of the sixth embodiment.

In FIG. 13, a first drain layer 111A, a first intermediate layer 112A, a first source layer 113A, a second source layer 113B, a second intermediate layer 112B, and a second drain layer 111B are formed on one X-directional side surface of the gate electrode 222. In the present embodiment, the structure illustrated in FIG. 13 may be adopted in place of the structure illustrated in FIGS. 12A to 12C. The structure illustrated in FIG. 12A to 12C has an advantage, however, that a region of the tunnel FET in which a tunnel current flows is approximately doubled in size, compared with the structure illustrated in FIG. 13.

In FIG. 14, the gate electrode 222 has a cylindrical planar shape when viewed from above the semiconductor substrate 101. In addition, a stacked layer in which the first drain layer 111A, the first intermediate layer 112A, the first source layer 113A, the second source layer 113B, the second intermediate layer 112B, and the second drain layer 111B are successively stacked is buried in this cylinder. As a result, this stacked layer is formed on the side surfaces of the gate electrode 222 via the gate insulator 221. In the present embodiment, the structure illustrated in FIG. 14 may be adopted in place of the structure illustrated in FIGS. 12A to 12C. Note however that the structure illustrated in FIGS. 12A to 12C has an advantage that a tunnel current flows easily and that the gate electrode 222 is easy to be fabricated, compared with the structure illustrated in FIG. 14.

(3) Method of Manufacturing Semiconductor Device of Sixth Embodiment

Next, a method of manufacturing a semiconductor device of a sixth embodiment will be described with reference to FIGS. 15A to 16B.

FIGS. 15A to 16B are cross-sectional views illustrating the method of manufacturing the semiconductor device of the sixth embodiment.

Figure 15A:
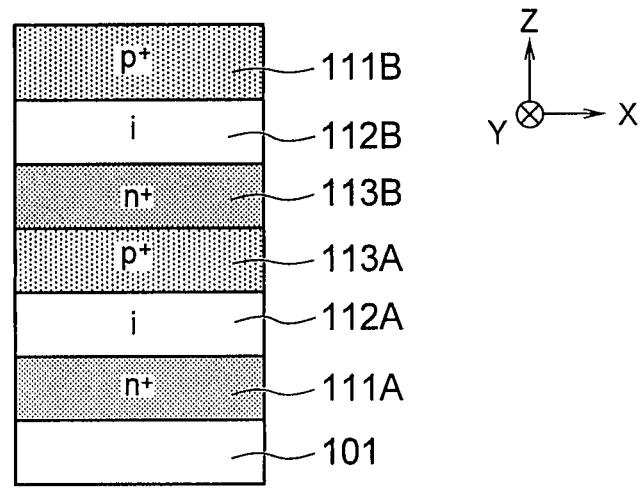
FIGS. 15A to 16B are cross-sectional views illustrating a method of manufacturing the semiconductor device of the sixth embodiment.

First, as illustrated in FIG. 15A, the first drain layer 111A, the first intermediate layer 112A, the first source layer 113A, the second source layer 113B, the second intermediate layer 112B, and the second drain layer 111B are successively deposited on the semiconductor substrate 101 by epitaxial growth.

Figure 15B:
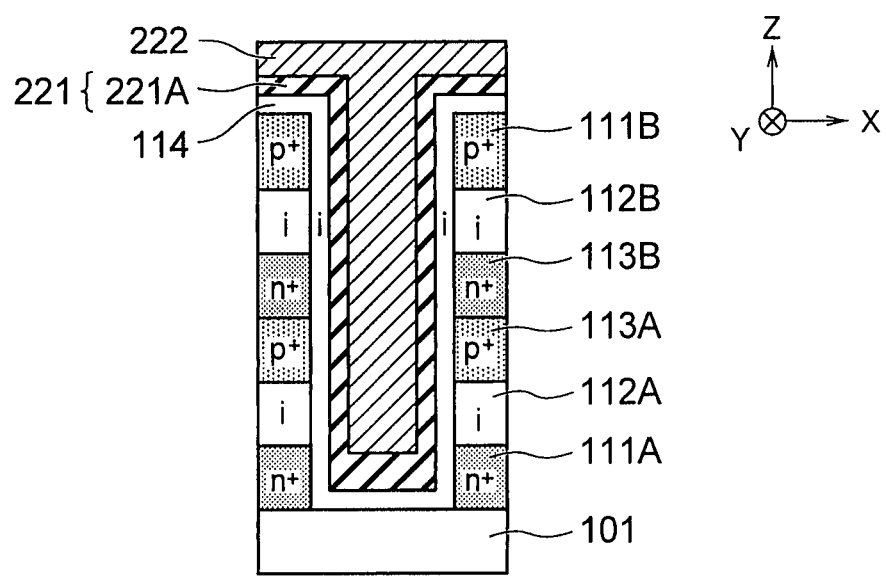

Next, a hole for the gate electrode 222 is created by lithography and RIE in the second drain layer 111B, the second intermediate layer 112B, the second source layer 113B, the first source layer 113A, the first intermediate layer 112A, and the first drain layer 111A (FIG. 15B). Next, an i type amorphous Si layer to serve as the semiconductor layer 114 and an insulating material 221A to serve as part of the gate insulator 221 are successively formed on the entire surface of the semiconductor substrate 101 (FIG. 15B). Next, the i type amorphous Si layer is crystallized by SPE. Next, an electrode material to serve as the gate electrode 222 is formed on the entire surface of the semiconductor substrate 101 (FIG. 15B). The electrode material is set to such a thickness as to fill the abovementioned hole.

Figure 16A:
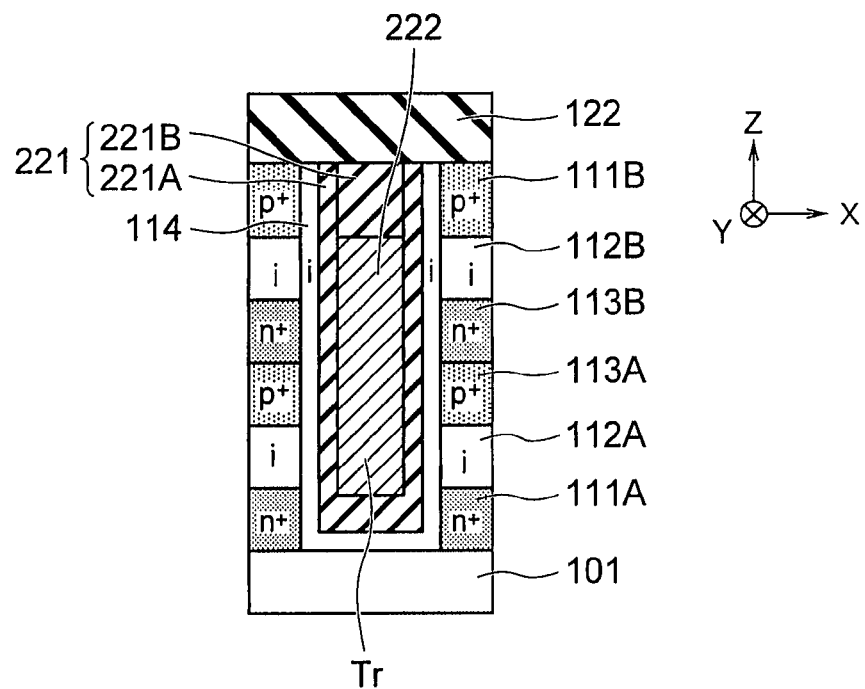

Next, this electrode material is etched to the depth of the lower surface of the second drain layer 111B (FIG. 16A). Next, an insulating material 221B to serve as part of the gate insulator 221 is back-filled in a region from which the electrode material is recessed (FIG. 16A). Next, an interlayer dielectric 122 is deposited on the entire surface of the semiconductor substrate 101 (FIG. 16A).

Figure 16B:
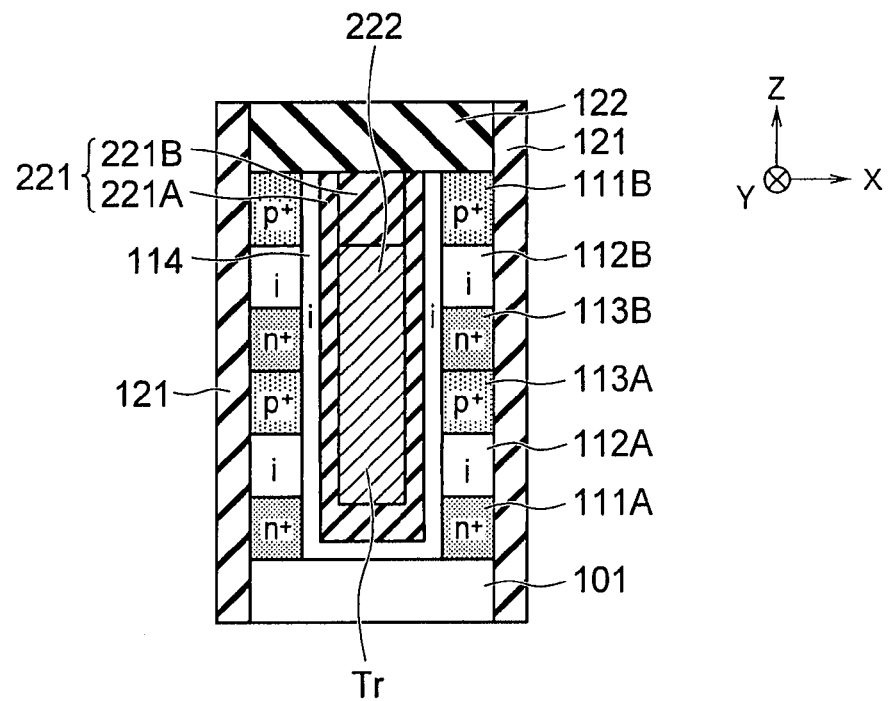

Next, an isolation trench for the isolation insulator 121 is formed by RIE in the second drain layer 111B, the second intermediate layer 112B, the second source layer 113B, the first source layer 113A, the first intermediate layer 112A, the first drain layer 111A, and the semiconductor substrate 101 (FIG. 16B). Next, an insulating material is back-filled in the isolation trench, and surfaces of this insulating material are planarized by CMP (FIG. 16C). As a result, the isolation insulator 121 is formed as illustrated in FIG. 16C.

Thereafter, in the present embodiment, contact plugs 301 to 304 are formed in the same way as the contact plugs 201 to 203. In addition, an interconnect layer, a via plug, an interlayer dielectric and the like are formed by an existing method. In this way, the semiconductor device illustrated in FIGS. 12A to 12C is manufactured.

(4) Effects of Sixth Embodiment

Finally, effects of the sixth embodiment will be described.

As described above, in the present embodiment, a CMOS circuit is fabricated by vertically stacking the n type tFET and the p type tFET on the semiconductor substrate 101.

Consequently, since there is no need to individually form the n type tFET and the p type tFET in separate regions, the number of manufacturing steps, including a lithography step, is kept small. In addition, since a deposition step, such as selective epitaxial growth, is carried out on a wide region in the present embodiment, the controllability of a deposition process is excellent. Therefore, according to the present embodiment, the CMOS circuit can be manufactured at low costs. In addition, since the n type tFET and the p type tFET are vertically stacked in the present embodiment, the CMOS circuit can be fabricated in a small occupied substrate area.

As described above, according to the present embodiment, it is possible to reduce the manufacturing cost of a CMOS circuit and cut down the occupied substrate area thereof.

(Seventh Embodiment)

Figure 17:
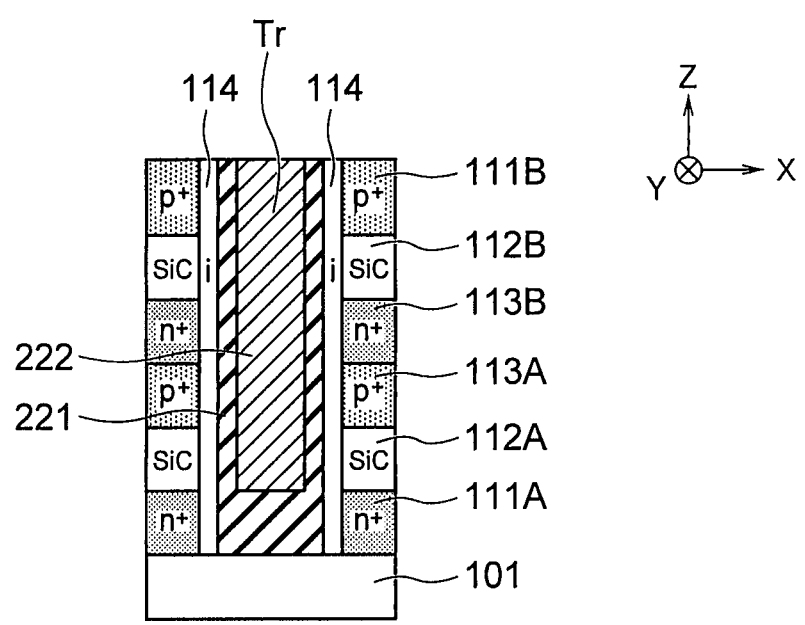
FIG. 17 is a cross-sectional view illustrating a structure of a semiconductor device of a seventh embodiment.

FIG. 17 is a cross-sectional view illustrating a structure of a semiconductor device of a seventh embodiment.

In the present embodiment, the first and second intermediate layers 112A and 112B are formed of a material having a wider bandgap than silicon. Forming the first and second intermediate layers 112A and 112B by using such a material has an advantage of being able to reduce an off-current and power consumption without changing the dimensions of the semiconductor device. Examples of such a material include SiC (silicon carbide). An SiC layer has an advantage of being easy to be epitaxially grown on a silicon substrate. In addition, the SiC layer has an advantage that it is easy to secure an etching selection ratio with respect to an n+ type layer and a p+ type layer and form a contact hole.

In the present embodiment, the semiconductor layer 114 is formed on the side surfaces of the first drain layer 111A, the first intermediate layer 112A, the first source layer 113A, the second source layer 113B, the second intermediate layer 112B, and the second drain layer 111B. Accordingly, the first and second intermediate layers 112A and 112B may be formed of an insulating material. Consequently, as in the case described above, it is possible to reduce an off-current and power consumption without changing the dimensions of the semiconductor device. In addition, the insulating material has an advantage that it is easy to secure an etching selection ratio with respect to an n+ type layer and a p+ type layer and form a contact hole.

Additionally, in the present embodiment, the first and second source layers 113A and 113B are formed of a material having a narrower bandgap than silicon. Forming the first and second source layers 113A and 113B by using such a material has an advantage of being able to increase an on-current without changing the dimensions of the semiconductor device and raise the operating speed of the CMOS circuit. Examples of such a material include SiGe, Ge, InAs and InGaAs.

The on-current can be controlled between each of the first and second source layers 113A and 113B and the semiconductor layer 114. In addition, the off-current can be controlled between the first drain layer 111A and the first intermediate layer 112A and between the second drain layer 111B and the second intermediate layer 112B. Consequently, in the present embodiment, both increase of the on-current and decrease of the off-current can be realized at the same time by forming the first and second intermediate layers 112A and 112B and the first and second source layers 113A and 113B by using the above-described materials, respectively.

(Eighth Embodiment)

Figure 18A:
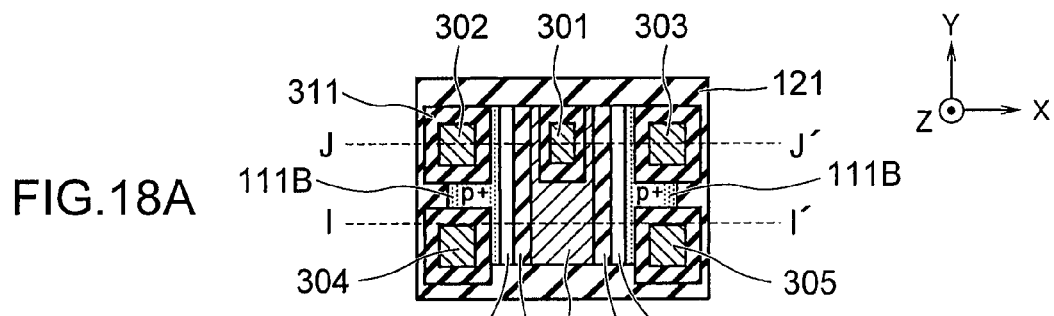
FIGS. 18A to 18C are cross-sectional views illustrating a structure of a semiconductor device of an eighth embodiment.
Figure 18B:
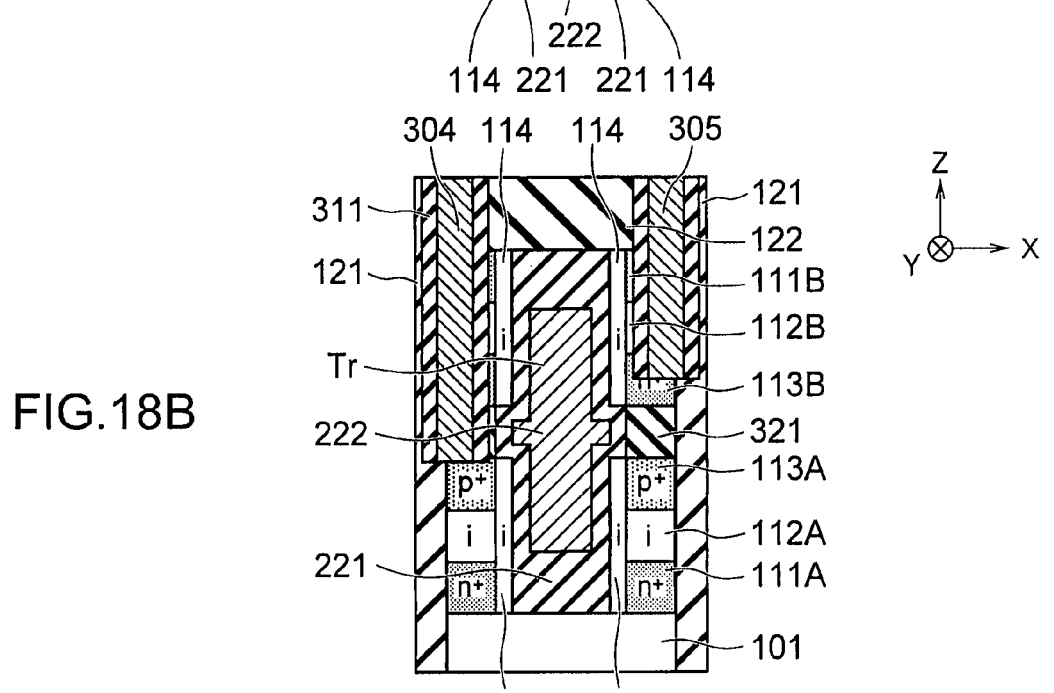
Figure 18C:
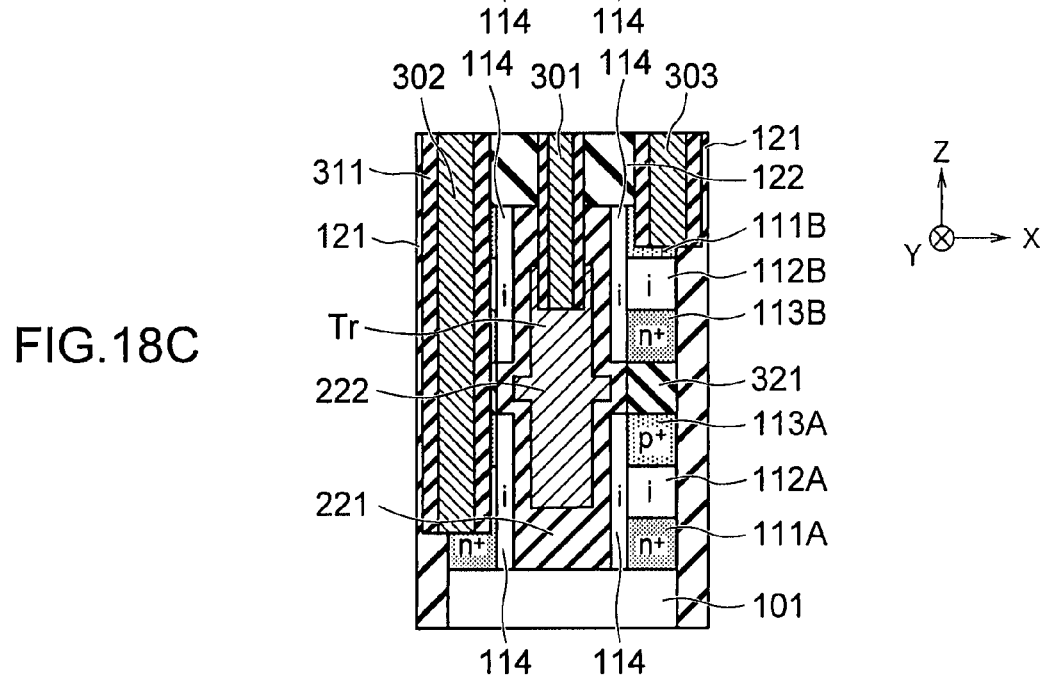

FIGS. 18A to 18C are cross-sectional views illustrating a structure of a semiconductor device of an eighth embodiment.

In FIGS. 18A to 18C, a second source layer 113B is stacked on a first source layer 113A via an insulator 321. The insulator 321 can be formed by epitaxially growing an insulating material for the insulator 321, for example, between a deposition step of the first source layer 113A and a deposition step of the second source layer 113B.

In addition, in the present embodiment, the semiconductor layer 114 is formed by selective epitaxial growth. Accordingly, as illustrated in FIGS. 18A to 18C, the semiconductor layer 114 is formed on the side surfaces of an n type tFET and a p type tFET, but is not formed on the side surfaces of the insulator 321. Thereafter, a gate insulator 221 is formed on the side surfaces of the insulator 321. Accordingly, the first source layer 113A and the second source layer 113B are segmentalized from each other by the insulator 321 and the gate insulator 221, as illustrated in FIGS. 18A to 18C. The first source layer 113A and the second source layer 113B can therefore have potentials independent of each other. Consequently, in the present embodiment, the n type tFET and the p type tFET can be operated as tFETs independent of each other.

For that reason, the semiconductor device illustrated in FIGS. 18A to 18C includes a contact plug 305, in addition to a contact plug 304. While the contact plug 304 penetrates the insulator 321 and is located on the first source layer 113A, the contact plug 305 is located on the second source layer 113B.

The insulator 321 is formed of an insulating material close in lattice constant to, for example, Si. This insulating material has an advantage that it is easy to epitaxially grow the insulator 321 on the first source layer 113A by molecular beam epitaxy or the like, and that it is also easy to epitaxially grow the second source layer 113B on the insulator 321. Examples of such an insulating material include $SrTiO_3$ and $CeO_2$.

In addition, in the present embodiment, first and second intermediate layers 112A and 112B and first and second source layers 113A and 113B may be formed of the materials described in the seventh embodiment.

Additionally, in the present embodiment, main terminal layers 111A, 113A, 113B and 111B may be an n+ type layer, a p+ type layer, an n+ type layer, and a p+ type layer, respectively. Still additionally, in the present embodiment, the main terminal layers 111A, 113A, 113B and 111B may be a p+ type layer, an n+ type layer, an n+ type layer and a p+ type layer, or may be an n+ type layer, a p+ type layer, a p+ type layer and an n+ type layer.

(1) Comparison Between Sixth Embodiment and Eighth Embodiment

Next, the sixth embodiment and the eighth embodiment will be compared with each other with reference to FIG. 19 to FIG. 22.

Figure 19:
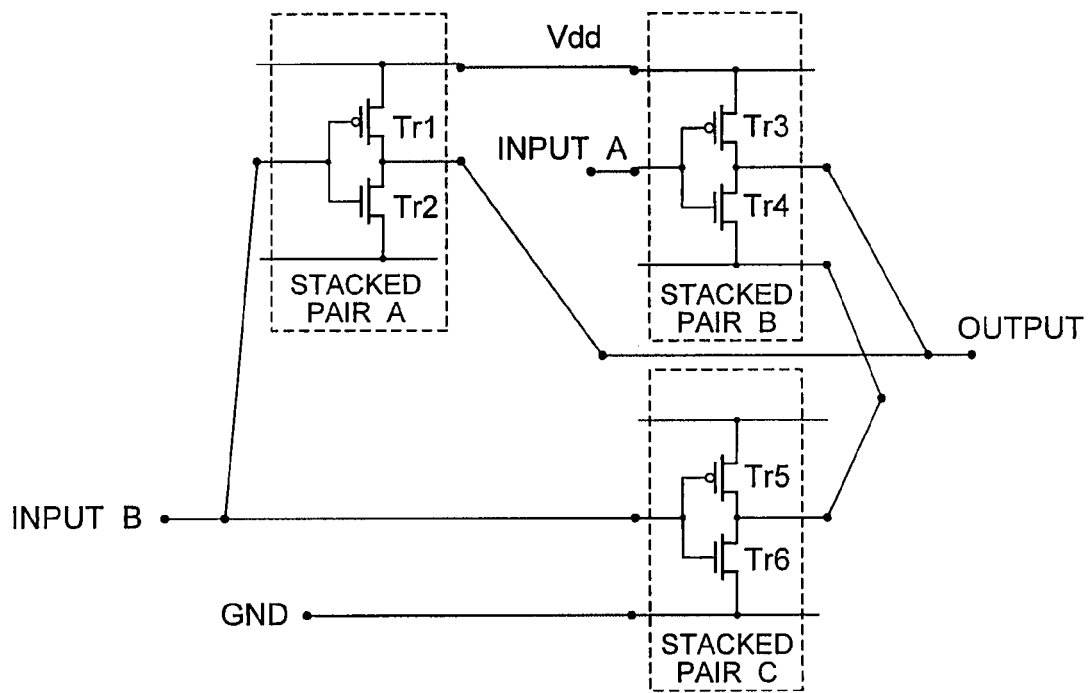
FIGS. 19 and 20 are circuit diagrams illustrating examples of a NAND gate and a NOR gate in the sixth embodiment, respectively.
Figure 20:
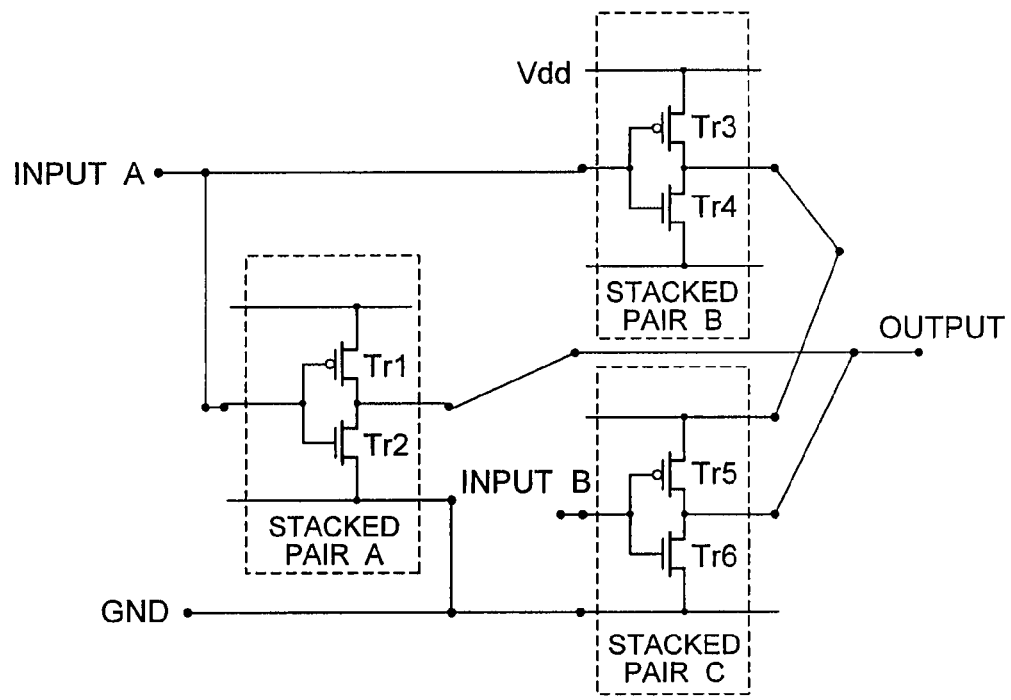
Figure 21:
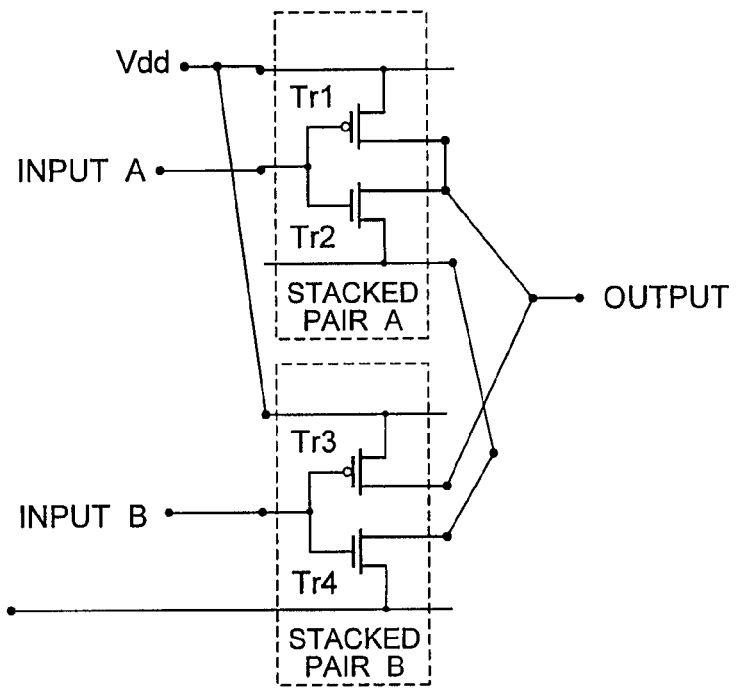
FIGS. 21 and 22 are circuit diagrams illustrating examples of a NAND gate and a NOR gate in the eighth embodiment, respectively.
Figure 22:
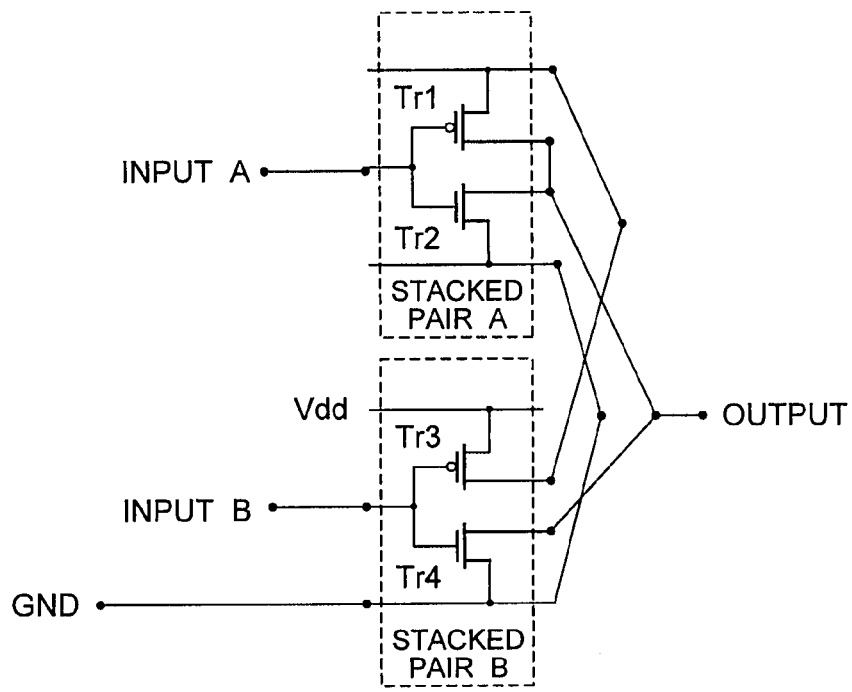

FIGS. 19 and 20 are circuit diagrams illustrating examples of a NAND gate and a NOR gate in the sixth embodiment, respectively. Likewise, FIGS. 21 and 22 are circuit diagrams illustrating examples of a NAND gate and a NOR gate in the eighth embodiment, respectively.

Stacked pairs A to C illustrated in FIGS. 19 to 22 denote pairs of vertically stacked n type and p type tFETs. In addition, Tr1 to Tr6 denote tFETs constituting these stacked pairs A to C. Additionally, straight lines connecting these tFETs to one another denote interconnection lines. FIGS. 19 to 22 further illustrates a power line Vdd, a grounding line GND, an input terminal A, an input terminal B, and an output terminal of a NAND gate and a NOR gate.

In the sixth embodiment, as described above, the first source layer 113A and the second source layer 113B of each stacked pair are at the same potential. In contrast, in the eighth embodiment, the first source layer 113A and the second source layer 113B of each stacked pair can have potentials independent of each other.

Accordingly, in the sixth embodiment, three stacked pairs are required in order to form a NAND gate or a NOR gate (FIGS. 19 and 20). In contrast, in the eighth embodiment, a NAND gate or a NOR gate can be formed of two stacked pairs (FIGS. 21 and 22).

As described above, according to the eighth embodiment, the same circuit can be formed in a smaller occupied substrate area, compared with the sixth embodiment. On the other hand, the sixth embodiment has an advantage of not requiring a step of forming the insulator 321.

(2) Effect of Eighth Embodiment

Finally, an effect of the eighth embodiment will be described.

As described above, in the present embodiment, the n type tFET and the p type tFET are vertically stacked via the insulator 321. Consequently, according to the present embodiment, the same circuit can be formed in a smaller occupied substrate area, compared with the sixth embodiment.

Although two tFETs are vertically stacked in the sixth to eighth embodiments, three or more tFETs may be vertically stacked.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor device comprising:
a semiconductor substrate;
a gate electrode provided on the semiconductor substrate via an insulating layer;
a gate insulator provided on a side surface and an upper surface of the gate electrode;
a semiconductor layer provided on the side surface and the upper surface of the gate electrode via the gate insulator; and
a stacked layer including a lower main terminal layer of a first conductivity type, an intermediate layer, and an upper main terminal layer of a second conductivity type which are successively stacked on the semiconductor substrate, the stacked layer being provided on the side surface of the gate electrode via the gate insulator and the semiconductor layer,
wherein the upper main terminal layer is provided on the side surface and the upper surface of the gate electrode via the gate insulator and the semiconductor layer.

2. The device of claim 1, wherein the intermediate layer is formed of a material having a wider bandgap than silicon, or formed of an insulating material.

3. The device of claim 2, wherein the intermediate layer is an SiC layer.

4. The device of claim 1, wherein the upper or lower main terminal layer is formed of a material having a narrower bandgap than silicon.

5. The device of claim 4, wherein the upper or lower main terminal layer is an SiGe layer, a Ge layer, an InAs layer, or an InGaAs layer.

6. The device of claim 1, further comprising:
an isolation insulator provided to surround the gate electrode and the stacked layer when viewed from above the semiconductor substrate, and having inner wall surfaces which contact the gate electrode and the stacked layer;
a first contact plug provided on the gate electrode; and
second contact plugs provided on the lower and upper main terminal layers,
wherein the first contact plug and the second contact plugs are disposed on different sides of the inner wall surfaces of the isolation insulator.

7. A semiconductor device comprising:
a semiconductor substrate;
a gate electrode provided on the semiconductor substrate via an insulating layer;
a gate insulator provided on a side surface of the gate electrode;
first and second semiconductor layers provided on the side surface of the gate electrode via the gate insulator; and
a stacked layer including a first lower main terminal layer of a first conductivity type, a first intermediate layer, a first upper main terminal layer of a second conductivity type, an insulator, a second lower main terminal layer of the first conductivity type, a second intermediate layer, and a second upper main terminal layer of the second conductivity type which are successively stacked on the semiconductor substrate, the stacked layer being provided on the side surface of the gate electrode via the gate insulator and the first and second semiconductor layers,
wherein
the first lower main terminal layer, the first intermediate layer and the first upper main terminal layer are provided on the side surface of the gate electrode via the gate insulator and the first semiconductor layer,
the second lower main terminal layer, the second intermediate layer and the second upper main terminal layer are provided on the side surface of the gate electrode via the gate insulator and the second semiconductor layer, and
the first and second semiconductor layers are separated from each other by the gate insulator.

8. The device of claim 7, wherein each of the first and second intermediate layers is formed of a material having a wider bandgap than silicon, or formed of an insulating material.

9. The device of claim 7, wherein the first upper or lower main terminal layer is formed of a material having a narrower bandgap than silicon.

10. The device of claim 7, wherein the second upper or lower main terminal layer is formed of a material having a narrower bandgap than silicon.

11. The device of claim 7, wherein the insulator is an $SrTiO_3$ layer or a $CeO_2$ layer.

12. A semiconductor device comprising:
a semiconductor substrate;
a gate electrode provided on the semiconductor substrate via an insulating layer;
a gate insulator provided on a side surface of the gate electrode;
first and second semiconductor layers provided on the side surface of the gate electrode via the gate insulator; and
a stacked layer including a first lower main terminal layer of a first conductivity type, a first intermediate layer, a first upper main terminal layer of a second conductivity type, an insulator, a second lower main terminal layer of the second conductivity type, a second intermediate layer, and a second upper main terminal layer of the first conductivity type which are successively stacked on the semiconductor substrate, the stacked layer being provided on the side surface of the gate electrode via the gate insulator and the first and second semiconductor layers,
wherein
the first lower main terminal layer, the first intermediate layer and the first upper main terminal layer are provided on the side surface of the gate electrode via the gate insulator and the first semiconductor layer,
the second lower main terminal layer, the second intermediate layer and the second upper main terminal layer are provided on the side surface of the gate electrode via the gate insulator and the second semiconductor layer, and
the first and second semiconductor layers are separated from each other by the gate insulator.

13. The device of claim 12, wherein each of the first and second intermediate layers is formed of a material having a wider bandgap than silicon, or formed of an insulating material.

14. The device of claim 12, wherein the first upper or lower main terminal layer is formed of a material having a narrower bandgap than silicon.

15. The device of claim 12, wherein the second upper or lower main terminal layer is formed of a material having a narrower bandgap than silicon.

16. The device of claim 12, wherein the insulator is an $SrTiO_3$ layer or a $CeO_2$ layer.

* * * * *